United States Patent [19]
Katakura

[11] Patent Number: 6,075,413
[45] Date of Patent: Jun. 13, 2000

[54] AMPLIFIER CIRCUIT AND CONTROL SIGNAL GENERATOR

[75] Inventor: Masayuki Katakura, Kanagawa, Japan

[73] Assignee: Sony Corporation, Japan

[21] Appl. No.: 09/260,033

[22] Filed: Mar. 2, 1999

Related U.S. Application Data

[63] Continuation of application No. 08/988,010, Dec. 10, 1997.

[51] Int. Cl.[7] .................................................. H03F 3/45
[52] U.S. Cl. ............................................ 330/252; 330/261
[58] Field of Search .................................. 330/252, 261, 330/295

[56] References Cited

U.S. PATENT DOCUMENTS

| | | | |
|---|---|---|---|
| 5,488,330 | 1/1996 | Masuoka et al. | 330/261 |
| 5,606,288 | 2/1997 | Prentice | 330/252 |
| 5,648,743 | 7/1997 | Nagaya et al. | 330/252 |
| 5,815,034 | 9/1998 | Takahashi | 330/261 |

*Primary Examiner*—Benny Lee
*Assistant Examiner*—Khanh Van Nguyen
*Attorney, Agent, or Firm*—Rader, Fishman & Grauer; Ronald P. Kananen

[57] ABSTRACT

By providing differential resistors in common emitters of pairs of differential transistor and differentially taking out signals from collectors, a circuit excellent in low noise property and linearity was obtained. Further, a ring type voltage controlled oscillation circuit is provided comprising n number of stages of variable delay circuits, a control signal generation circuit weighting n+1 outputs taken out of the voltage controlled oscillation circuit by a phase control signal voltage and controlling the phase, and a phase locked loop means for locking the phase by comparing the output of the voltage controlled oscillation circuit and an external pixel clock.

3 Claims, 13 Drawing Sheets

FIG. 3
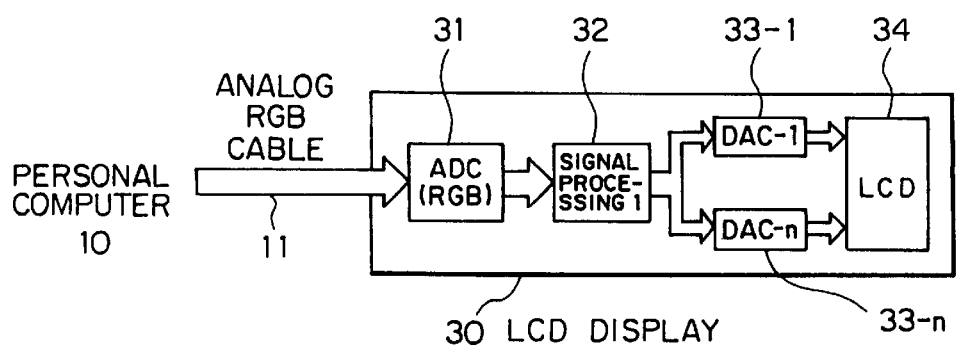
FIG. 4A
PIXEL CLOCK
FIG. 4B
DAC OUTPUT
FIG. 4C
FIRST S/H PULSE
FIG. 4D
SECOND S/H PULSE
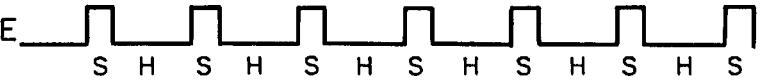
(RELATED ART)

$IC_{11} = I_o + i_1$
$IC_{12} = I_o - i_2$
$IE = 2 \cdot I_o + i_1 - i_2$
$VE = V_o + v$

AMPLIFIER CIRCUIT AND CONTROL SIGNAL GENERATOR

This application is a continuation of application Ser. No. 08/988,010 filed Dec. 10, 1997.

BACKGROUND OF THE INVENTION

1. Field of the Invention

The present invention relates to an input circuit preferred for an initial stage circuit such as a receiving circuit of a radio communication circuit, more particularly relates to an input circuit excellent in both of a low noise property and a high linearity by using bipolar transistors.

The present invention further relates to a phase adjustment circuit, more particularly relates to a phase adjustment circuit giving a constant range of adjustment and adjustment sensitivity and a good linearity and stability of adjustment without regard as to the clock frequency for controlling the apparatus to be adjusted.

The present invention further relates to a control signal generation circuit for generating a plurality of control signals which are selectively used in the phase adjustment etc. and analog-interpolated, more particularly relates to a control signal generation circuit giving a good linearity and stability in the control signal to be generated.

2. Description of the Related Art

In the initial stage of a radio communication circuit, for example, a very wide dynamic range is required. This is because it is necessary to handle a wide range of everything from extremely weak input signal conditions where the transmission side is remote to large input conditions where the transmission side is in close proximity.

As a circuit using bipolar transistor elements, an emitter ground circuit shown in FIG. 1A and a differential amplification circuit shown in FIG. 1B are generally used, but sufficiently satisfactory performances were not obtained by these circuit configurations of the related art.

First, while an emitter ground circuit is excellent in its noise characteristic, the linearity at the time of a large input is extremely poor. On the other hand, when adopting a differential amplification circuit, the linearity is improved somewhat, but the allowable maximum input level was about ±10 to 20 mV at most—which cannot be said to be a sufficient level. Further, by inserting a feedback resistor between the emitters, it is possible to improve the linearity, but in this case, there was the drawback that the noise characteristic was deteriorated.

Further, in a radio communication circuit eta. when a modulated signal of a narrow bandwidth is handled, among the non-linear components, particularly the odd number components are considered a problem. This is because in the mixed modulated components produced by a plurality of signals in a signal bandwidth, the mixed modulated components due to the even number non-linear components fall out of the bandwidth of the signal, but in contrast the mixed modulated components due to the odd number non-linear component may fall in the signal bandwidth. While a field effect transistor (FET) has a square characteristic, a bipolar transistor has an exponential characteristic, so the belief up to this point was that a bipolar transistor was considerably inferior in linearity.

Further, in an electronic apparatus such as a personal computer or a work station, the trend is for replacement of the cathode ray tubes (CRTs or Braun tubes) used as the displaying means to be replaced by liquid crystal displays (LCDs) and other flat panel displays. Further, in place of presentations by overhead projectors (OHPs) of the related art, presentations are now increasingly being made using projection type projectors which can be directly connected to personal computers to serve as their displays. Many of such projectors also use LCDS.

These displays use the same interfaces and connection methods as those of the CRT displays, therefore in current usage, analog RGB (red-green-blue) signals are transmitted. In the future, digital transmission will naturally be conceivable, but so long as CRT displays are the mainstream, transmission of analog RGB signals must be considered the basic assumption.

On the other hand, in an LCD or other flat panel display, a pixel is comprised by an independent unit and has a discrete structure unlike in a CRT display, therefore it is necessary to sample the signals transmitted in the analog format again and convert them to discrete signals. Signals from a personal computer are inherently discrete signals, so it is very wasteful to convert them to continuous signals and sample them again, but this is unavoidable so far as the assumption is the use of the interface of a CRT display.

FIG. 2 is a view of the configuration of a system where a display use output data from a personal computer 10 is output to an LCD 20 (first related art). The display use output digital data held in a video random access memory (RAM) 6 in the personal computer 10 is converted to an analog RGB signal by a digital-to-analog converter (D/A converter) and transmitted to the !LCD 20 via an analog RGB cable 11.

In the LCD 20, the received analog RGB signal is subjected to $\gamma$ correction processing for correcting the non-linear characteristic of the LCD elements and processing for the luminance and contrast, is sampled by a sample-and-hold circuit (S/H circuit) 22, and then converted to a parallel signal by a second signal processing unit 23 which is used to drive an LCD panel 24.

Here, a time corresponding to one pixel is referred to as a pixel clock and is about 20 to 100 MHz. Further, there are several types of structures of the elements constituting the LCD panel 24. For example, there are a super twisted nematic (STN) type and a thin film transistor (TFT) type providing thin film transistors in individual liquid crystal elements. Further, the TFT type includes a type using amorphous silicon and a type using polycrystalline silicon.

In the TFT type using polycrystalline silicon, a relatively high speed operation is possible. Therefore, for example, in the case of a viewfinder of a video camcorder or a small liquid crystal monitor or other LCD panel of at most about 200,000 pixels, it is possible to read the signal as it is based on the pixel clock. When it comes to the monitor of a personal computer 10, however, there are at least 300,000 pixels. Also, the frame frequency is considerably higher than that of a TV signal. Accordingly, not matter what structure is adopted, the signal cannot be input as it is based on such a high speed clock and displayed on the LCD panel 24. For example, in a TFT type using amorphous silicon, one horizontal scanning line's worth of a signal is converted once to a parallel signal and the signal written for every row.

Further, in a TFT type using polycrystalline silicon capable of performing a relatively high speed operation, a signal sent by the pixel clock frequency is converted to, for example, two to 12 parallel signals, the clock frequency used for reading is lowered, and the signals are input to the liquid crystal panel 24. Note that this processing is carried out at the sample-and-hold circuit 22 and the second signal processing unit 23.

Further, FIG. 3 is a view of the configuration of a system based on a different configuration where the display use output data from the personal computer 10 is output to an LCD 30 (second related art). In this related art, the analog RGB signal transmitted from the personal computer 10 via the analog RGB cable 11 is converted to a digital signal again by an analog-to-digital converter (A/D converter) 31, subjected to the processing of γcorrection etc. by the first signal processing unit 32, and then converted to parallel signals- in which the clock frequency is lowered by a plurality of D/A converters 33-1 to 33-n which are used to drive the LCD panel 34.

Next, an explanation will be made of the significance of the timing of the sampling operation and holding-operation in the sample-and-hold (S/H) circuit 22 of the first related art. FIGS. 4A to 4D are timing chart of signals in the system of the first related art.

Assume that the output of the D/A converter 7 of the personal computer 10 changes at the rising edge of the pixel clock as shown in FIGS. 4A and 4B. Here, the output of the D/A converter 7 is ideally a sharp steplike waveform output as indicated by a dotted line of FIG. 4B, but becomes a rounded waveform as indicated by a solid line of for example FIG. 4B due to the effect of the performances of the D/A converter 7, input/output circuit, interface cable, etc. The rounding shown the figure is simple rounding by a primary time constant, but in actuality it becomes a more complex waveform, for example, a waveform accompanied by overshooting. Further, this waveform distortion due to rounding etc. becomes relatively more severe in a monitor having a higher pixel clock and higher degree of precision.

The output of this D/A converter 7 is sampled again by the sample-and-hold circuit 22 (ADC31 in second related art), but if the rear edge portion of the output data of the D/A converter 7 can be sampled well at the timing indicated as a first sample-and-hold (S/H) pulse in for example FIG. 4C, the output thereof becomes relatively faithful to the original signal. However, if the front edge portion of the output data of the D/A converter 7 is sampled by a timing as indicated in the second sample-and-hold (S/H) pulse of FIG. 4D, the output thereof becomes remarkably different from the original waveform.

Such a phenomenon is peculiar to a computer image output. Namely, this is because a dot of one black pixel or a fine line in a white background and an image reverse to this are extremely ordinary in a text image and graphic image. Note that such a phenomenon does not occur in an image obtained from the camera.

Good management of the timing shown in FIGS. 4A to 4D, however, is not possible in actuality. This is because the pixel clock is not supplied from the personal computer 10 side, therefore usually the pixel clock is reproduced based on the horizontal synchronization signal in the LCD 20. On the other hand, the personal computer 10 side does not manage the phases of the pixel clock of the D/A converter 7 and the horizontal synchronization signal, therefore the pixel clocks of the personal computer 10 side and the LCD 20 side are generated independently from each other. Even if it is desired to manage them, where, for example, the pixel clock is near 100 MHz, if the required precision is represented by time, it becomes about 1 to 2 ns. Accordingly, the management thereof becomes very difficult. Even if it becomes possible, it is very difficult to reproduce a pixel clock with a precision of 1 to 2 ns from a horizontal synchronization signal of about several tens of kHz on the LCD 20 side.

At the present time, therefore, a manual phase adjustment means is provided on the LCD 20 side, and the phase is appropriately adjusted while viewing the image quality. As a means for making adjusting the phase, conventionally use has been made of a polarity inversion circuit and a variable delay circuit. In very simple apparatuses, there also exists means for adjusting the phase by only polarity inversion, but these are not satisfactory in terms of the image quality.

FIG. 5 shows an example of a typical variable delay circuit using a bipolar transistor circuit. Basically, this is configured as a buffer using a differential type current mode logic (CML) circuit. This inserts a capacity element C between emitters of emitter followers Q5 and Q6 and controls the current Ic by a control voltage Vc so as to control the delay time. The maximum value of the delay obtained by this circuit is 180° converted to a phase. Accordingly, in order to secure a range of adjustment of 180°, a structure connecting at least two stages in series is necessary. Since the pixel clock changes, the extent of change of, the control current Ic cannot be made too large, and other reasons, the range of adjustment is unexpectedly narrow. Accordingly, in actuality, a structure in which at least four stages to eight stages are connected in series becomes necessary.

However, phase adjustment by such a variable delay circuit of the related art involves some problems. First, in order to handle several types of display modes such as in a multi-scan display, it is necessary for the pixel clock to change over a wide range, but if the extent of change is increased, the required number of stages becomes larger.

Second, the linearity of the control characteristic is very bad. For example, in the variable delay circuit of FIG. 5, one of the reasons of the degraded linearity is basically that the delay time is in inverse proportion to the control current Ic. Further, due to the frequency characteristic of the transistors, particularly the delay time of the differential buffers of the npn transistors Q7 and Q8, even if the control current Ic is increased, the delay time does not become smaller in inverse proportion to this. Note that this phenomenon becomes remarkable particularly when the pixel clock becomes high.

Third, one of the objects of a phase adjustment circuit is high precision phase adjustment, but one of its components, that is, the variable delay circuit, sets the delay time. This means that a change of the pixel clock greatly changes the phase and the range of adjustment thereof. Namely, a great change of the adjustment sensitivity leads to the necessity of excessively raising the resolution over the original adjustment precision where it is desired to give phase adjusted data as the digital data.

Further, fourth, it is also difficult to obtain stable characteristics from the viewpoints of the power supply voltage dependency and the temperature dependency in the phase adjustment circuit of the related art.

SUMMARY OF THE INVENTION

A first object of the present invention is to solve the poor linearity of bipolar transistor circuits and provide an input circuit excellent in both of a low noise property and high linearity by using bipolar transistors.

A second object of the present invention is to provide a phase adjustment circuit giving a constant range of adjustment and adjustment sensitivity and good linearity and stability of adjustment without regard to the clock frequency (pixel clock frequency) for controlling the apparatus to be adjusted.

Further, a third object of the present invention is to provide a control signal generation circuit for generating a plurality of control signals which are selectively used in phase adjustment or the like and analog-interpolated, which control signal generation circuit gives a good linearity and stability of the generated control signals.

According to a first aspect of the present invention, there is provided an input circuit provided with a pair of differential transistors provided with first and second transistors with emitters which are commonly connected and through which a collector current flows when there is no signal; a bias voltage source for biasing the base potential of each of the first and second transistors; an inputting means for differentially applying first and second input signal voltages superimposed on outputs of the bias voltage source to bases of the first and second transistors; an impedance circuit connected to the common emitters of the pair of differential transistors and provided with a differential resistor; and an outputting means for differentially obtaining output signals from the collector currents of the first and second transistors, wherein the product of the sum of collector currents of the first and second transistors when there is no signal and the differential resistor of the impedance circuit is set to a value of less than a thermoelectric voltage of the first and second transistors.

According to a second aspect of the present invention, there is provided an input circuit provided with a pair of differential transistors provided with first and second transistors with emitters which are commonly connected and through which the collector current (IO) flows when there is no signal; a bias voltage source for biasing the base potential of each of the first and second transistors; an inputting means for differentially applying first and second input signal voltages superimposed on outputs of the bias voltage source to bases of the first and second transistors; an impedance circuit connected to the common emitters of the pair of differential transistor s and provided with a differential resistor; a third transistor with an emitter which is connected to the common emitters of the first and second transistors via a resistor element and through which a collector current (Ix) flows when there is no signal; a second bias voltage source for biasing the base potential of the third transistor; and an outputting means for differentially obtaining output signals from the collector currents of the first and second transistors, wherein the product of the sum (2×Io+Ix) of sum of the collector currents of the first and second transistors when there is no signal and the collector current of the third transistor when there is no signal and the differential resistor of the impedance circuit is set to a value of at least ½ and not more than 10 times of the thermoelectric voltage of the first and second transistors.

Further, according to a third aspect of the present invention, there is provided an input circuit having a pair of differential transistors provided with first and second transistors with emitters which are commonly connected and through which a collector current (Io) flows when there is no signal; a bias voltage source for biasing the base potential of each of the first and second transistors; an inputting means for differentially applying first and second input signal voltages superimposed on outputs of the bias voltage source to bases of the first and second transistors; an impedance circuit connected to the common emitters of the pair of differential transistors and provided with a differential resistor; a third transistor with an emitter which is connected to the common emitters of the first and second transistors and through which a collector current (Ix) flows when there is no signal; a second bias voltage source for biasing the base potential of the third transistor; and an outputting means for differentially obtaining output signals from the collector currents of the first and second transistors, wherein the product of the sum (2×Io+Ix) of the sum of the collector currents of the first and second transistors when there is no signal and the collector current of the third transistor when there is no signal and the differential resistor of the impedance circuit is set to a value of at least ½ and not more than 10 times the thermoelectric voltage of the first and second transistors.

In the simple differential amplification circuit of the related art, due to the poorness of the linearity thereof, about ±10 to 20 mV at most can be obtained as the allowable maximum input. Alternatively, as a result of attempting to improve the linearity by an emitter feedback resistor, although a certain degree of linearity is obtained, a side effect such as deterioration of the noise characteristic arises as well. That is, in the differential amplification circuit, the noise characteristic and the linearity (that is the allowable maximum input) are contradictory in relationship. In the input circuit of the present invention, by positively utilizing the impedance of the same phase mode in the common emitters of the pair of differential transistors, transistors forming the differential amplification circuit were operated in terms of A and B classes and the linearity was greatly enhanced. As a result of this, the allowable maximum input can be surprisingly increased with no deterioration of the noise characteristic. Namely, conventionally, a bipolar element has been thought to have a small maximum allowable input though excellent in low noise property, but according to the input circuit using bipolar transistors of the present invention, it is possible to achieve both a low noise property and a higher maximum allowable input at a high level.

Recently, cellular telephones and other radio communication apparatuses have spread remarkably among consumers. When applying the input circuit of the present invention at the initial stage of the receiving circuits of such apparatuses, for example, it is possible to handle both the large input conditions where the apparatus is in close proximity to the base station and the very small input conditions within the limits of the communicable area, therefore it is possible to obtain both of a low noise property and a high linearity.

According to a fourth aspect of the present invention, there is provided a phase adjustment circuit provided with a voltage controlled oscillation circuit provided with serially connected n number of stages (n is a positive integer) of variable delay circuits and performing negative feedback of the output of the final stage variable delay circuit to the input of the initial stage variable delay circuit; a phase locked loop means for comparing phases of the output of the voltage controlled oscillation circuit and a clock supplied from an external unit, outputting a delay control signal to control the delay time in each stage of variable delay circuit of the voltage controlled oscillation circuit, and locking the phase; a control signal generation circuit which outputs k (k is an integer of at least 3) number of weighting coefficient signals based on a phase control signal supplied from an external unit and interpolates the middle section so that the maximum number of weighting coefficient signals are given at substantially equal intervals with respect to the phase control signal and so that the sum of the weighting coefficients is substantially constant; and a weighting means for weighting each of the k number of signals of substantially equal phase differences taken out from the stages of the variable delay circuits in the voltage controlled oscillation circuit and each of the k number of weighting coefficient signals output by the control signal generation circuit and outputting the result as the output signal of the phase adjustment circuit.

Preferably, in the phase adjustment circuit of the present invention, the control signal generation circuit is constituted provided with k-1 number of sets of a pair of common-emitter differential transistors comprised of a first and second transistor with emitters connected and of a current source connected to the common emitters of the pair of the common-emitter differential transistor; a first weighting coefficient signal output is taken out from a collector of the first transistor of the first pair of common-emitter differential transistors; a k-th weighting coefficient signal output is taken out of a collector of the second transistor of a k-1-th pair of common-emitter differential transistors; a collector of the second transistor of an i-th (i is at least 1 and not more than k-2) pair of common-emitter differential transistors is connected to a collector of the first transistor of an i+1-th pair of common-emitter differential transistors; an i+1-th weighting coefficient signal output is taken out of a collector of the second transistor of the i-th pair of common-emitter differential transistors; and a phase control signal is supplied to the base of one transistor of each of the first and second transistors of k-1 number of pairs of common-emitter differential transistors, and a voltage obtained by substantially equally dividing the first and second reference potentials by k-1 is supplied to the base of the other transistor.

Preferably, in the phase adjustment circuit of the present invention, the variable delay circuit is constituted provided with a current mode logic (CML) buffer circuit provided with two emitter-follower circuits having transistors and current sources connected to the emitters of the transistors and controlled by the delay control signal from the phase locked loop means and with a pair of common-emitter differential transistors comprising a second and third transistor with connected emitters and provided with a capacity element connected between emitters of the transistors of the two emitter-follower circuits.

Preferably, in the phase adjustment circuit of the present invention, the number k of the weighting coefficient signals or the substantially equal phase difference signals taken out of the voltage controlled oscillation circuit is equal to n+1, the phases of the first to n-th substantially equal phase difference signals are arranged so as to equally divide 180° by n; and an n+1-th substantially equal phase difference signal has an inverse phase to that of the first substantially equal phase difference signal.

Alternatively, in the phase adjustment circuit of the present invention, the number k of the weighting coefficient signals or the substantially equal phase difference signals taken out of the voltage controlled oscillation circuit is equal to 2·n+1; phases of the first to 2·n-th substantially equal phase difference signals are arranged so as to equally divide 360° by n; and a 2·n+1-th substantially equal phase difference signal has the same phase as that of the first substantially equal phase difference signal.

According to a fifth aspect of the present invention, there is provided a control signal generation circuit provided with k-1 number of sets (k is a positive integer) of a pair of common-emitter differential transistors comprised of a first and second transistor with connected emitters and a current source connected to the common emitters of the pair of common-emitter differential transistors, wherein a first weighting coefficient signal output is taken out of a collector of the first transistor of a first pair of common-emitter differential transistors; a k-th weighting coefficient signal output is taken out of a collector of the second transistor of a k-1-th pair of common-emitter differential transistors; a: collector of the second transistor of an i-th (i is at least 1 and not more than k-2) pair of common-emitter differential transistors is connected to a collector of the first transistor of an i+1-th pair of common-emitter differential transistors; an i+1-th weighting coefficient signal output is taken out of a collector of the second transistor of an i-th pair of common-emitter differential transistors; and the phase control signal is supplied to the base of one transistor of each of the first and second transistors of k-1 number of pairs of common-emitter differential transistors, and the voltage obtained by substantially equally dividing the first and second reference potentials by k-1 is supplied to the base of the other transistor.

Preferably, the control signal generation circuit of the present invention is provided with k-2 number of current sources respectively connected to the second to k-1-th weighting coefficient signal outputs; voltages obtained by substantially equally dividing the first and second reference voltages by k-1 are supplied to the base of the first transistor of each of the k-1 number of pairs of common-emitter differential transistors; and the phase control signal is supplied to the-base of the second transistor.

Alternatively the control signal generation circuit of the present invention is provided with k number of current sources respectively connected to all of the k number of weighting coefficient signal outputs; the phase control signal is supplied to the base of the first transistor of each of the k-1 number of pairs of common-emitter differential transistors; and voltages obtained by substantially equally dividing the first and second reference voltages by k-1 are supplied to the base of the second transistor.

For example, in a driving circuit of a LCD device, when discrete signals such as image signals from a personal computer are used as the input, it is very important which portion of the signal is sampled. Therefore, it is indispensable that the phases of the input signal and the sample pulse be adjusted. In the control signal generation circuit of the present invention and a phase adjustment circuit using the same, a plurality of signals of substantially equal phase differences are generated by a ring type voltage controlled oscillation circuit, a weighting coefficient signal controlled by an external phase control signal is weighted with respect to a substantially equal phase difference signal, and phase adjustment is carried out by the result of the weighting, therefore the adjustment sensitivity and the range of adjustment can be maintained constant without regard to the pixel clock frequency and it becomes achieve a good linearity and stability of adjustment.

Namely, in the phase adjustment circuit of the present invention, a range of adjustment of from 0 to 360° can be always obtained irrespective of the pixel clock. Even if the pixel clock changes within a wide range, the required number of stages of the variable delay circuits is not increased unlike in the related art. Therefore, the invention is particularly suitable for cases when having to deal with several types of display modes like in a multi-scan display.

Further, in the control signal generation circuit of the present invention and a phase adjustment circuit using the same, the linearity of the control characteristic is good. This is because, even though the weighting coefficient signal is generated interpolating the middle section so that the maximum number is given at substantially equal intervals with respect to the phase control signal and the sum thereof is substantially constant, basically the weighting coefficient signal is switched.

Further, in the phase adjustment circuit of the present invention, not the delay time, but the phase is controlled, therefore even if the pixel clock frequency changes, the control sensitivity does not change. Accordingly, together with good linearity, when the adjustment data is transferred as digital data, the lowest resolution is enough.

Further, the phase adjustment circuit of the present invention is stable against fluctuations in the temperature and the power supply voltage. This is because the delay time of the variable delay circuit is automatically adjusted by a phase locked loop (PLL) means so as to correspond to the phase of the pixel clock (external clock).

BRIEF DESCRIPTION OF THE DRAWINGS

These and other objects and features of the present invention will become clearer from the following description of the preferred embodiments given with reference to the attached drawings, in which FIGS. 1A and 1B are circuit diagrams of circuits using bipolar transistor elements of the related art, in which FIG. 1A is a circuit diagram of an emitter-ground circuit and FIG. 1B is a circuit diagram of a differential amplification circuit;

FIG. 3 is a view of another configuration of a system where display use output data from a personal computer is output to an LCD;

FIGS. 4A to 4D are timing charts of signals in the system of a first related art;

DESCRIPTION OF THE PREFERRED EMBODIMENTS

Figure 1A:
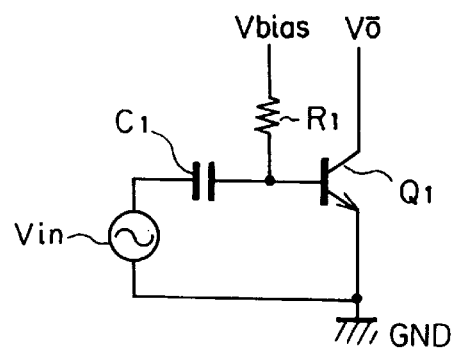
Figure 1B:
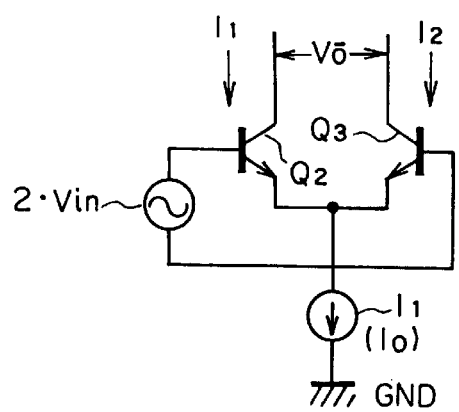
Figure 2:
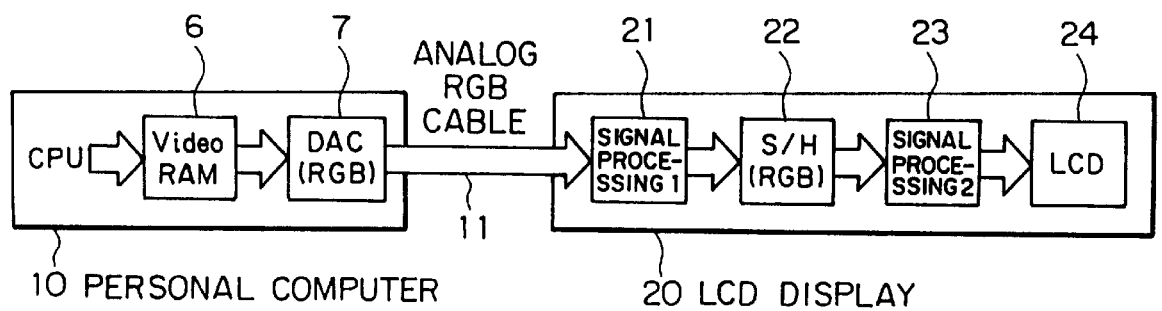
FIG. 2 is a view of the configuration of a system where display use output data from a personal computer is output to an LCD.

Below, a detailed explanation will be made of embodiments of the different aspects of the present invention by referring to the drawings.

Figure 6:
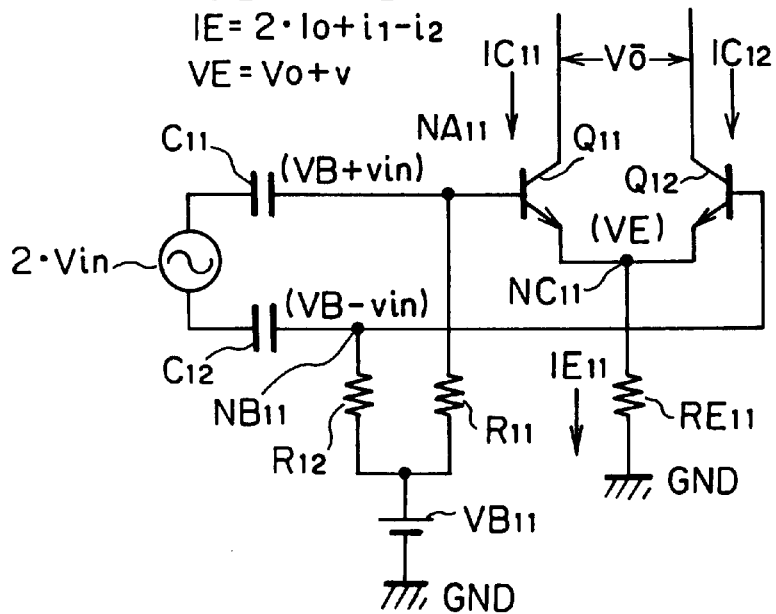
FIG. 6 is a circuit diagram of an input circuit according to a first embodiment of the present invention.

FIG. 6 is a circuit diagram of an input circuit according to a first embodiment of the present invention. The connection configuration per se of the circuit of the present embodiment is not particularly novel, but the characteristic feature of the input circuit of the present embodiment resides in that the bias voltage VB, accordingly the common emitter potential VE, is set to a value that satisfies a predetermined condition and that a pair of differential npn transistors Q11 and Q12 constituting a differential amplification circuit is operated in terms of A and B classes by applying a differential input to the input and thereby made to perform an operation with a high linearity.

In FIG. 6, the input circuit of the present embodiment is formed by providing a pair of differential transistors comprised of first and second npn transistors Q11 and Q12 with emitters which are commonly connected and through which a collector current Io flows when there is no signal; a bias voltage source VB11 for biasing the base potential of each of the first and second npn transistors Q11 and Q12; an inputting means for differentially applying first and second input signal voltages vin and −vin superimposed on the output VB of the bias voltage source VB11 to the bases of the first and second npn transistors Q11 and Q12; an emitter resistor connected to the common emitters of the pair of differential transistors (Q11, Q12) and provided with a differential resistor RE11; and an outputting means for differentially obtaining output signals Vo from collector currents IC11 and IC12 of the first and second npn transistors Q11 and Q12.

Further, the inputting means is formed by providing an input voltage source for supplying an input voltage 2·vin; a capacity element C11 with one end connected to one end of the input voltage source and with the other end connected to the base of the first npn transistor Q11; a capacity element C12 with one end connected to one end of the input voltage source and with the other end connected to the base of the second npn transistor Q12; a resistor element R11 with one end connected to the bias voltage source VB11 and with the other end connected to the base of the first npn transistor Q11; and a resistor element R12 with one end connected to the bias voltage source VB11 and with the other end connected to the base of the second npn transistor Q12. By this configuration, a voltage VB+vin will be supplied to the node NA11 (base of the first npn transistor Q11), and a voltage VB−vin will be supplied to the node NB11 (base of the second npn transistor Q12).

In the input circuit of the present embodiment providing with the configuration as described above, the product of the sum (2×Io) of collector currents of the first and second transistors Q11 and Q12 when there is no signal and the emitter resistor RE is set to a value from at least substantially ½ to not more than one time the thermoelectric voltage VT. Here, the thermoelectric voltage VT is represented as VT=kT/q (here, k is Boltzmann's constant, T is an absolute temperature, and q is charge of electrons) and is about 26 mV at room temperature.

Next, in order to prove the suitability of the above setting in the input circuit of the present embodiment, first an operational analysis of the circuit is carried out. The input voltage is defined as 2·vin, collector currents of the first and second npn transistors Q11 and Q12 are respectively defined as IC11 and IC12, the voltage and current of the emitter resistor RE are respectively defined as VE11 and IE11, and their DC components are divided into amounts of change and represented as in the following equations.

$$IC11 = Io + i1 \quad (1)$$

$$IC12 = Io + i2 \quad (2)$$

$$IE11 = 2 \cdot Io + i1 - i2 \quad (3)$$

$$VE11 = Vo + v \quad (4)$$

Here, if the saturation current of a transistor is defined as Is and the thermoelectric voltage is defined as VT (=kT/q; where k is Boltzmann's constant, T is the absolute temperature, and q is the charge of electrons), the following equations are established:

$$IC11 = Is \cdot \exp\{(VB + vin - VE11)/VT\} \quad (5)$$

$$IC12 = Is \cdot \exp\{(VB + vin - VE11)/VT\} \quad (6)$$

$$IC11 + IC12 = VE11/RE11 \quad (7)$$

Next, when these equations are represented separated into the DC component and the change component, they become the following equations:

$$Io + i1 = Is \cdot \exp\{(VB - VE11)/VT\} \cdot \exp\{(vin - v)/VT\} \quad (8)$$
$$= Io \cdot \exp\{(vin - v)/VT\}$$

$$\therefore i1 = Io\{\exp((vin - v)/VT) - 1\} \quad (9)$$

$$Io - i2 = Is \cdot \exp\{(VB - VE11)/VT\} \cdot \exp\{(-vin - v)/VT\} \quad (10)$$
$$= Io \cdot \exp\{(-vin - v)/VT\}$$

$$\therefore i2 = -Io\{\exp((-vin - v)/VT) - 1\} \quad (11)$$

$$(Io + i1) + (Io + i2) = (Vo + v)/RE11 \quad (12)$$

$$\therefore i1 - i2 = v/RE11 \quad (13)$$

Further, when these equations are cleaned up, the following equation can be obtained:

$$\exp(vin/VT) + \exp(-vin/VT) = 2\{(v/Vo) + 1\} \cdot \exp(v/VT) \quad (14)$$

However, the voltage v cannot be found analytically as it is. Accordingly, the final solution is obtained by a numerical analysis. First, a rough optimum solution will be considered. The rough optimum solution is used as the initial value of the numerical analysis. The collector current when there is no signal (vin=0) is Io, and the transfer conductance Gmo at this time is defined as follows. When the value is found, the next equation is obtained:

$$Gmo = \partial(IC11 - IC12)/\partial vin = 2 \cdot Io/VT \quad (15)$$

Next, consider a state where the absolute value of the input signal voltage vin becomes very large. In this state, only one of the collector currents IC11 and IC12 becomes much larger than the collector current Io when there is no signal. The other is cut off and becomes zero. As a result, only one of the first and second npn transistors Q11 and Q12 acts as if it were an emitter-ground circuit. The transmission conductance Gmo at this time should approximate 1/RE11. Therefore, if RE11=1/Gmo is set, the transmission conductance should not be that far from the optimum solution since the input signal voltage vin passes through Gmo at three points of 0 and ±∞. Accordingly, it is seen that the emitter voltage VE11=Vo when there is no signal may be set to:

$$Vo = VT \quad (16)$$

Figure 7:
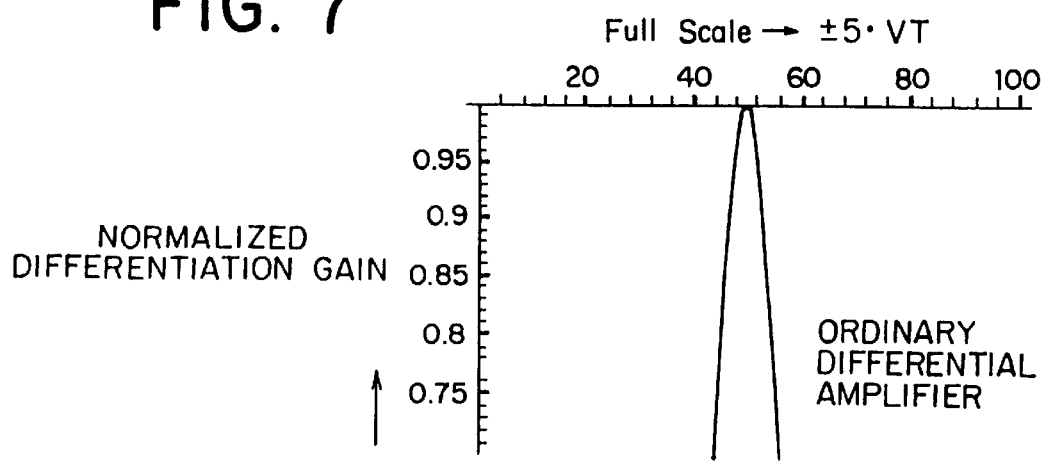
FIG. 7 is an explanatory view of a differentiation gain characteristic in a usual differential amplification circuit.

Next, whether this is the true optimum solution or only an approximate solution is found by numerical analysis. FIG. 7 plots the differentiation gain with respect to the input level in a usual differential amplification circuit for comparison. In the explanatory view representing the differentiation gain characteristic of FIG. 7, the Y-axis indicates the differentiation gain normalized when input signal voltage vin=0, and the X-axis indicates a scale obtained by equally dividing ±5·VT (±130 mV) by 100. Further, FIG. 8 plots the result of numerical analysis by assigning an estimated value of the optimum solution found by Equation (16) on the explanatory view showing a similar characteristic to that of FIG. 7.

Figure 8:
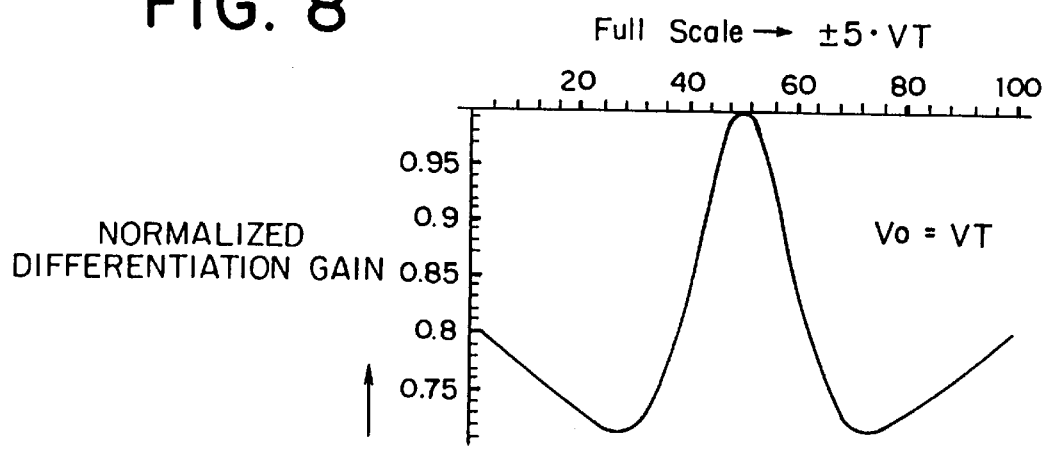
FIG. 8 is an explanatory view of a differentiation gain characteristic in the case where Vo is set to VT in an input circuit of a first embodiment of the present invention.

When the differentiation gain characteristic of the result obtained by performing numerical analysis by defining Vo=VT shown in FIG. 8 is compared with the differentiation gain characteristic in the usual differential amplification circuit shown in FIG. 7, it is seen that the range of the signal level in which the change of the same differentiation gain occurs is increased two fold. Further, when the signal level is made extremely large, the normalized differentiation gain approaches 1 again, but tends to fall once when it moves away from the center (vin=0).

Figure 9:
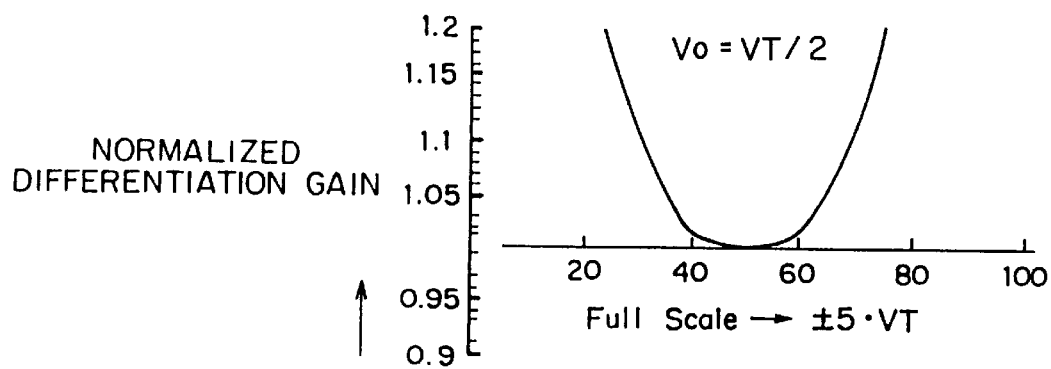
FIG. 9 is an explanatory view of a differentiation gain characteristic in the case where Vo is set to VT/2 in the input circuit of the first embodiment.

Further, the result of numerical analysis setting the emitter voltage Vo at the time of no signal to Vo=VT/2 in order to make the first and second npn transistors Q11 and Q12 operate in terms of A and B classes is shown in FIG. 9. While differing according to what extent of change of the differentiation gain is permitted, it is seen that the input range is increased several fold when compared with the differentiation gain characteristic in the usual differential amplification circuit of FIG. 7.

Figure 10:
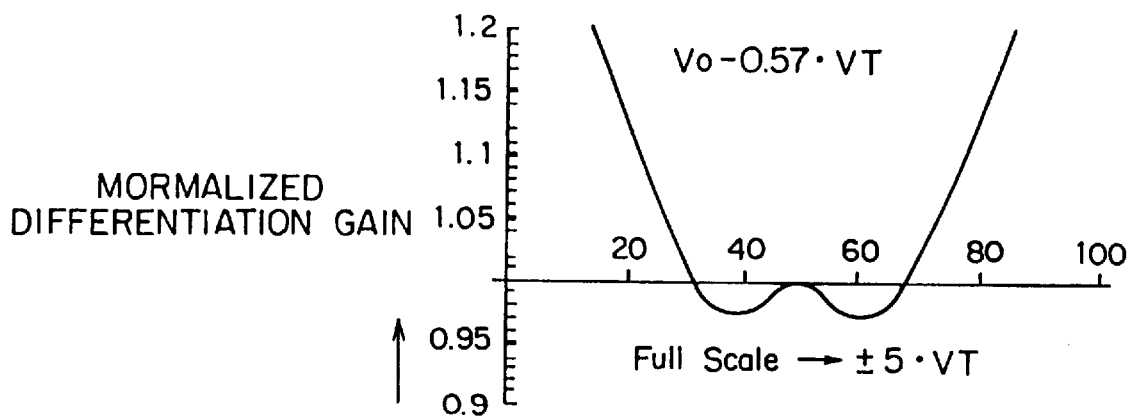
FIG. 10 is an explanatory view of a differentiation gain characteristic in the case where Vo is set to 0.57·VT in the input circuit of the first embodiment.

While not being able to be derived well analytically, by the above numerical analysis, it is seen that one of the optimum solutions in the present embodiment, regarding the setting of the emitter voltage Vo when there is no signal, existed at Vo=VT/2. Further, the emitter voltage Vo when there is no signal is set to slightly larger than VT/2. For example, when Vo=15 mV (=0.57·VT) is set, a characteristic obtained by inverting the two-peak characteristic shown in FIG. 10 is obtained. In comparison with the differentiation gain characteristic (FIG. 9) at the time of the setting Vo=VT/2, the differentiation gain characteristic in the setting Vo=15 mV is inferior in the linearity of small signals, but further enhanced in the linearity when the signal is large, although the amount of enhancement is small.

Figure 11:
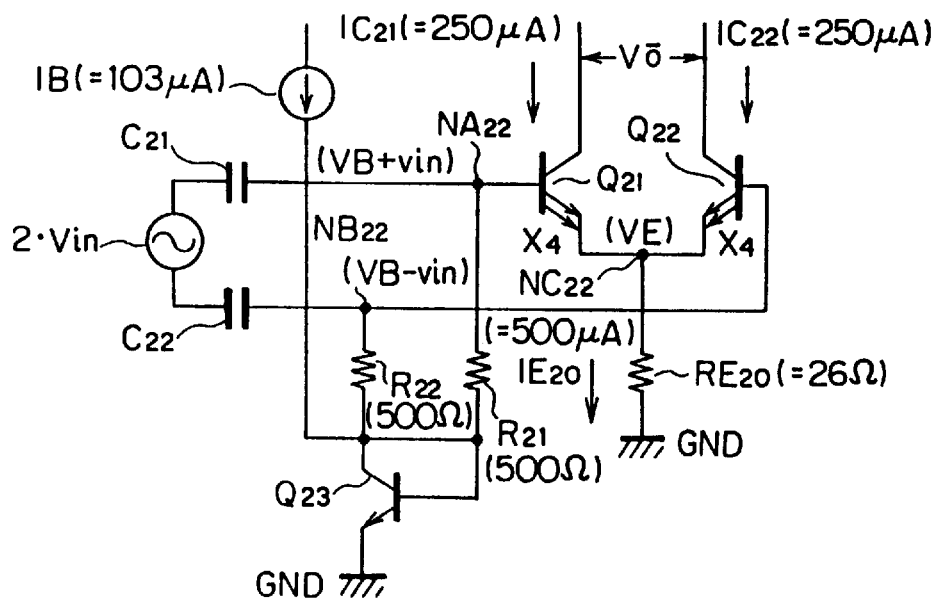
FIG. 11 is a circuit diagram of a more concrete circuit configuration of the first embodiment.

Next, FIG. 11 is a more detailed circuit diagram of the circuit configuration of the present embodiment including also the bias circuit. Namely, in FIG. 11, the bias voltage source VB is realized by a configuration comprising an npn transistor (diode) Q23 with a base and collector connected to a connection point of resistors R21 and R22 and a current source IB for supplying a current to the collector of the npn transistor Q23.

In FIG. 6, the collector currents Io of the first and second npn transistors Q21 and Q22 when there is no signal were set to 250 µA. The bias voltage VB is set by passing a 100 µA bias current IB through the diode Q23. Further, the emitter potential (potential of node NC22) VE21 of the first and second npn transistors Q21 and Q22 is set to Vo=VT/2=13 mV by the ratio between the emitter current density of the first and second npn transistors Q21 and Q22 and the emitter current density of the npn transistor Q23 and the emitter resistor RE20. Note that the emitter resistor RE20 (26 Ω) has a resistance value considerably lower than the value which can be easily realized in an integrated circuit and requires a relatively large space on the chip for realization, but it is sufficiently warranted when considering the effect of enhancement of the linearity by the input circuit of the present embodiment.

Figure 12:
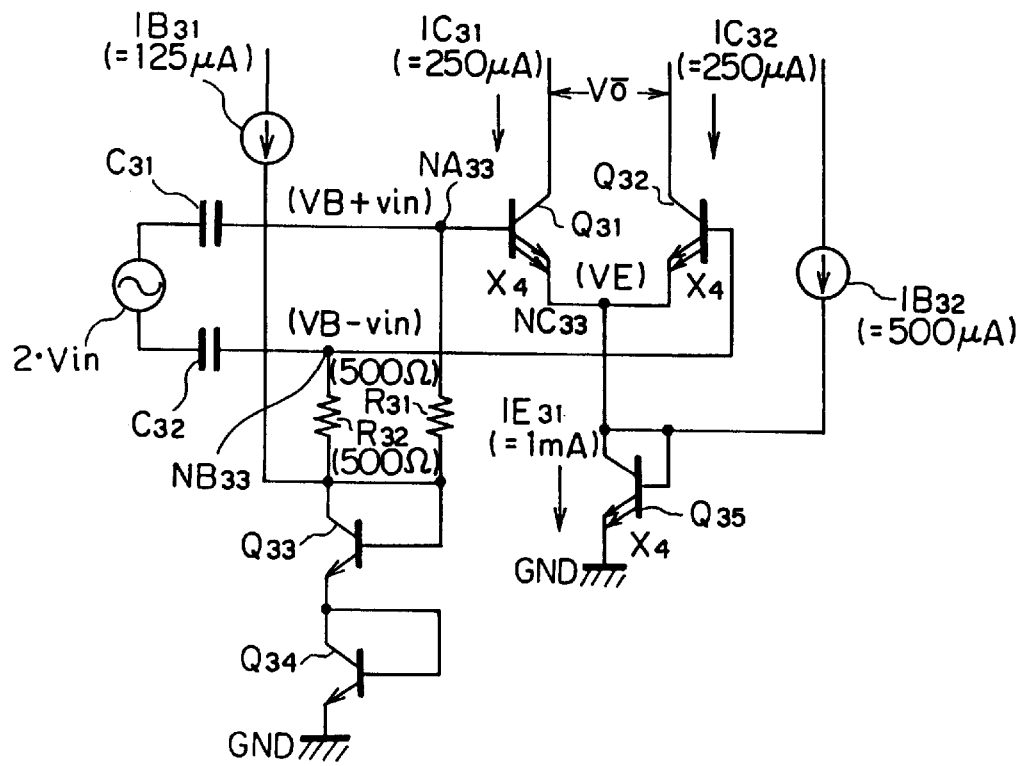
FIG. 12 is a circuit diagram of a modification of the input circuit of the first embodiment.

FIG. 12 is a circuit diagram of a modification of the input circuit of the present embodiment. In the present modification, the emitter resistor RE is realized by a diode Q35, and transistors for realizing the bias voltage source VB are achieved by serially connecting the npn transistors Q33 and Q34. According to the configuration of the present modification, by replacing the emitter resistor RE20 in FIG. 11 with its considerably low resistance by the diode Q35, there is the merit of reducing the space occupied on the chip. Note that the impedance of the diode Q35 becomes non-linear, so the effect of enhancement of the linearity becomes smaller than the result obtained above.

Next, an explanation will be made of an input circuit according to a second embodiment of the present invention in which the effect of the enhancement of the linearity in the input circuit of the first embodiment is further dramatically improved.

In the input circuit of the first embodiment, when the emitter voltage Vo at the time of no signal is set large in order to increase the range in which the linearity is maintained, as clear also from the differentiation gain characteristic of FIG. 8, the differentiation gain fell once near the relatively medium amplitude of the signal level, that is, near the peak value=±1·VT to 2·VT of the signal. In order to eliminate this phenomenon, in the present embodiment, as shown in FIG. 13, a configuration is adopted adding a third npn transistor Q46, an emitter resistor RE42, and a second bias voltage source VB42 to the configuration of the input circuit of the first embodiment (FIG. 6).

Figure 13:
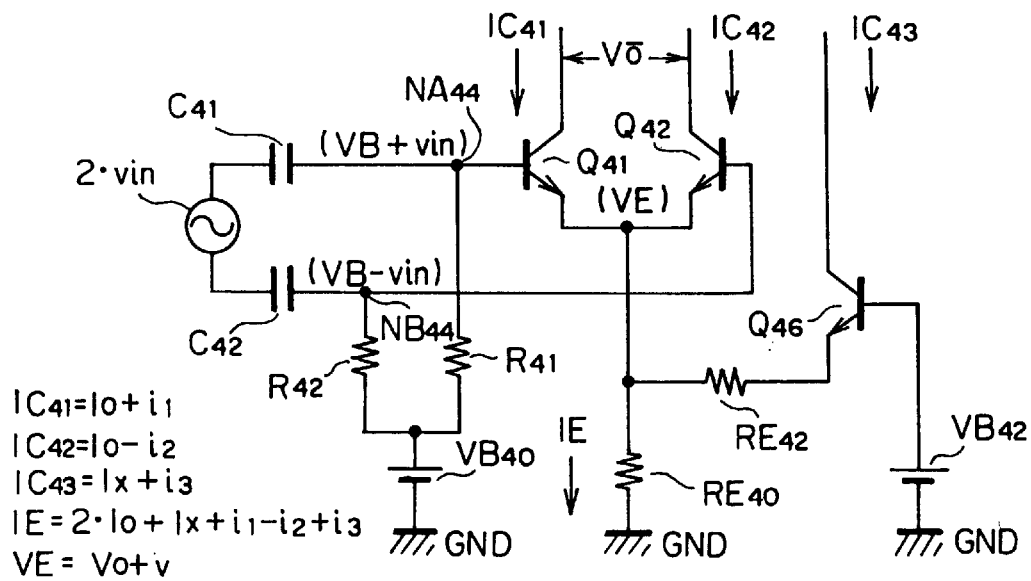
FIG. 13 is a circuit diagram of an input circuit according to a second embodiment of the present invention.

In FIG. 13, the input circuit of the present embodiment is formed by providing a pair of differential transistors comprised of first and second npn transistors Q41 and Q42 with emitters which are commonly connected and through which the collector current Io flows when there is no signal; a bias voltage source VB40 for biasing the base voltage of each of the first and second npn transistors Q41 and Q42; an inputting means for differentially applying first and second input signal voltages vin and −vin superimposed on outputs of the bias voltage source VB40 to bases of the first and second npn transistors Q41 and Q42; an emitter resistor RE40 connected to the common emitters of the pair of differential transistors (Q41, Q42); a third npn transistor Q46 with an emitter which is connected to the common emitters of the first and second npn transistors Q41 and Q42 via the emitter resistor RE42 and through which the collector current Ix flows when there is no signal; a second bias voltage source VB42 for biasing the base voltage of the third npn transistor Q46; and an outputting means for differentially obtaining the output signal from collector currents of the first and second npn transistors Q41 and Q42.

In the input circuit of the present embodiment, the product of the sum (2×Io+Ix) of the sum of the collector currents of the first and second npn transistors Q41 and Q42 when there is no signal and the collector current of the third npn transistor Q46 when there is no signal with the emitter resistor RE40 is set to a value of at least ½ to not more than 10 times the thermoelectric voltage VT. Here, the thermoelectric voltage VT is represented by VT=kT/q (where, k is Boltzmann's constant, T is the absolute temperature, and q is the charge of electrons) and is about 26 mV at room temperature.

Next, in order to prove the suitability of the above setting in the input circuit of the present embodiment, the operation of the circuit is analyzed. The input circuit of the present embodiment bypasses the emitter current IE flowing through the emitter resistor RE only when the input signal voltage vin is small by the addition of the third npn transistor Q46 so as to suppress and flatten the peak caused near the input signal voltage vin=0 as shown in the differentiation gain characteristic of FIG. 8. Below, the effect by the addition of the third npn transistor Q46 will be analyzed. Note that, for simplification, the analysis is carried out by defining the resistance of the emitter resistor RE42 of the third npn transistor Q46 as zero.

First, in the same way as in the first embodiment, voltages and currents are represented while separated into the DC component and the AC component as follows:

$$IC41 = Io - i1 \tag{17}$$

$$IC42 = Io + i2 \tag{18}$$

$$IC43 = Io + i3 \tag{19}$$

$$IE = 2 \cdot Io + Ix + i1 - i2 + i3 \tag{20}$$

$$VE = Vo + v \tag{21}$$

Further, the following equations can be derived:

$$IC41 = Is \cdot \exp\{(VB40 + vin - VE)/VT\} \quad (23)$$

$$IC42 = Is \cdot \exp\{(VB40 - vin - VE)/VT\} \quad (24)$$

$$IC43 = Is \cdot \exp\{(VB42 - VE)/VT\} \quad (25)$$

$$IC41 + IC42 + IC43 = VE/RE40 \quad (26)$$

Next, these equations are expressed separated into the DC component and the change component:

$$Io + i1 = Is \cdot \exp\{(VB40 - VE)/VT\} \cdot \exp\{(vin - v)/VT\} \quad (27)$$
$$= Io \cdot \exp\{(vin - v)/VT\}$$

$$\therefore i1 = Io\{\exp((vin - v)/VT) - 1\} \quad (28)$$

$$Io - i2 = Is \cdot \exp\{(VB40 - VE)/VT\} \cdot \exp\{(-vin - v)/VT\} \quad (29)$$
$$= Io \cdot \exp\{(-vin - v)/VT\}$$

$$\therefore i2 = Io\{\exp((-vin - v)/VT) - 1\} \quad (30)$$

$$Ix + i3 = Is \cdot \exp\{(VB42 - Vo)/VT\} \cdot \exp(-v/VT) \quad (31)$$
$$= Ix \cdot \exp(-v/VT)$$

$$\therefore i3 = -Ix\{\exp(-v/VT) - 1\} \quad (32)$$

$$(Io + i1) + (Io + i2) + (Ix + i3) = (Vo + v)/RE40 \quad (33)$$

$$\therefore i1 - i2 + i3 = v/RE40 \quad (34)$$

Further, when these equations are cleaned up, the following equations can be obtained:

$$Io \cdot \exp\{(vin - v)/VT\} + Io \cdot \exp\{(-vin - v)/VT\} + Ix \cdot \exp(-v/VT) = \quad (35)$$
$$v/RE40 + (2 \cdot Io + Ix)$$

$$\exp(vin/VT) + \exp(-vin/VT) + Ix/Io = \quad (36)$$
$$(2 + Ix/Io)(v/Vo + 1) \cdot \exp(v/VT)$$

When comparing this with Equation (14) in the first embodiment, Equation (36) takes the form obtained by adding a term of Ix/Io to the left side and right side of Equation (14). Also Equation (36) cannot analytically solved more than this in the same way as in Equation (14) of the first embodiment, therefore, below, numerical analysis is carried out in the same way as in that of the first embodiment.

Figure 14:
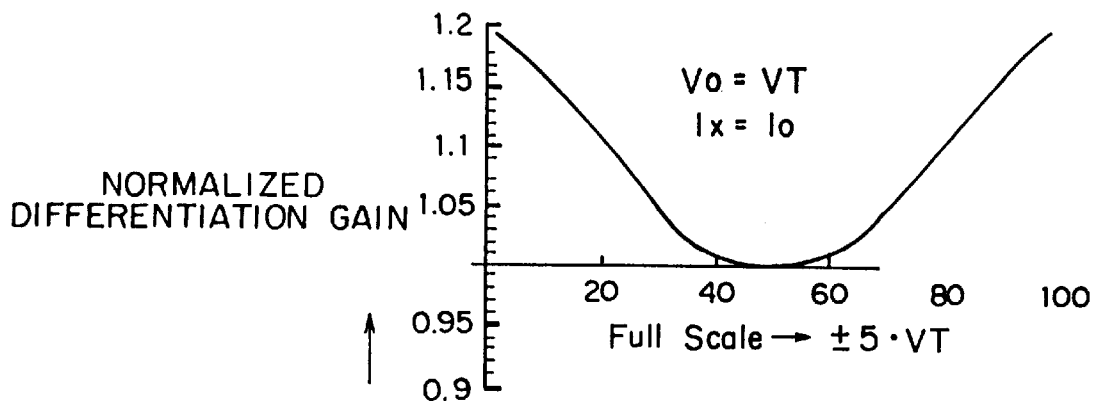
FIG. 14 is an explanatory view of a differentiation gain characteristic in the case where Vo is set to VT and Ix is set to Io in the input circuit of the second embodiment.

First, consider a case where the emitter voltage when there is no signal is defined as Vo=VT. When the effect of the third npn transistor Q43 is not considered, the differentiation gain characteristic in this case becomes as shown in FIG. 8 in the same way as in the first embodiment. Contrary to this, where the collector. current when there is no signal is defined as Ix=Io, the differentiation gain characteristic becomes as shown in FIG. 14. In the differentiation gain characteristic shown in FIG. 14, it is apparent that a greater effect of enhancement of linearity is obtained in comparison with FIG. 9 showing the corresponding differentiation gain characteristic in the first embodiment.

Figure 15:
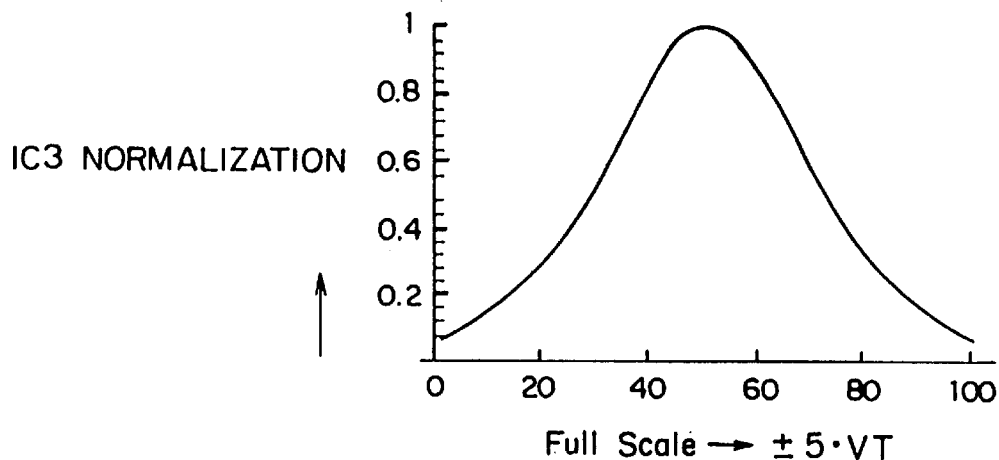
FIG. 15 is an explanatory view of a collector current characteristic of a third npn transistor of the input circuit of the second embodiment.

Further, the effect of the third npn transistor Q46 becomes clear by checking the collector current IC43 of the third npn transistor Q46. In the collector current IC43, as shown in FIG. 15, the peak of the differentiation gain near the input signal voltage vin=0 in the differentiation gain characteristic shown in FIG. 8 of the first embodiment is suppressed by bypassing the current near the input signal voltage vin=0.

Figure 16:
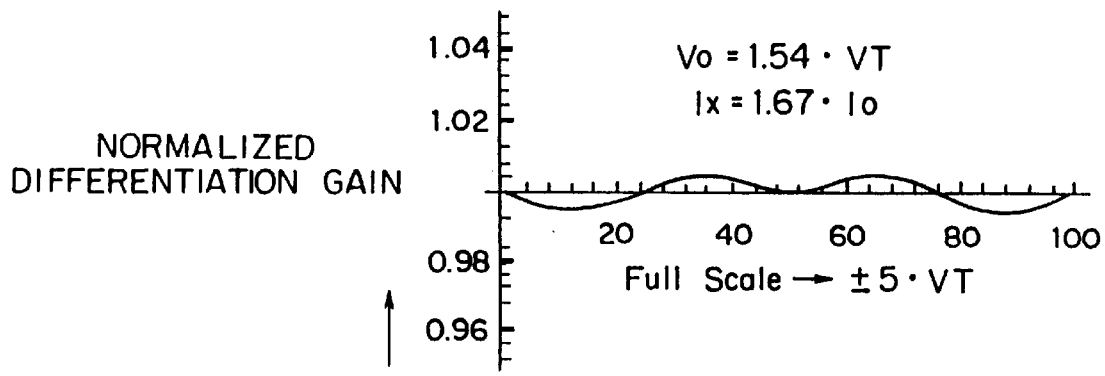
FIG. 16 is an explanatory view of a differentiation gain characteristic in the case where Vo is set to 1.54·VT and Ix is set to 1.67·Io in the input circuit of the second embodiment.

In the differentiation gain characteristic of FIG. 8, if the peak of the differentiation gain near the input signal voltage vin=0 can be suppressed by the third npn transistor Q46, the linearity may be more enhanced by taking a slightly larger common emitter voltage Vo when there is no signal. FIG. 16 shows the differentiation gain characteristic when Vo=40 mV ($\approx 1.54 \cdot VT$) is set and Ix/Io=1.67 is set. It is apparent from FIG. 16 that an almost perfect differentiation gain characteristic is realized over a wide input range of ±5·VT.

Further, if greater fluctuation of the differentiation gain characteristic is permitted, a larger emitter voltage Vo when there is no signal can be taken. The fluctuation of the differentiation gain characteristic at this time can be suppressed to a certain extent by the emitter resistor RE42 of the third npn transistor Q46. Namely, in FIG. 13, the effect of the emitter resistor RE42 of the third npn transistor Q46 is that the by-pass effect by the third npn transistor Q46 shown in the differentiation gain characteristic of FIG. is given over a wider range of the input voltage vin. Accordingly, even if the emitter voltage Vo when there is no signal is set to a larger value, an effect of suppression of the fluctuation of the differentiation gain characteristic can be given.

Next, the definition of the emitter voltage Vo when there is no signal will be given. It is not always necessary to form the emitter resistor RE40 with a passive resistor element. For example, it is also possible to use a transistor as in the circuit configuration of the modification of the first embodiment shown in FIG. 12. Note that in the present embodiment, if the non-linearity of a circuit equivalently constituting the emitter resistor RE is large, a desired effect of enhancement cannot be obtained, therefore it is necessary to provide an impedance circuit having a good linearity.

The voltage Vo is defined as the product of the sum of the value of the differential resistor (AC current resistor) of the impedance circuit for realizing the emitter resistor RE and the collector currents IC41, IC42, and IC43 flowing into this (collector currents IC41 and IC42 in the first embodiment).

Next, the voltage Vo with which the effect aimed at by the present invention (high linearity) is obtained will be considered. In the first embodiment, the flattest characteristic was obtained when Vo=VT/2 according to numerical analysis. If a slightly larger voltage Vo is taken, while there will be accompanying fluctuation of the differentiation gain characteristic, a slight enhancement is seen in the linearity with respect to a large amplitude. Accordingly, preferably the voltage Vo is substantially from VT/2 to about (3/4)VT. If it exceeds VT, the fluctuation of the differentiation gain characteristic becomes too large and the gain may not be suitable for the object of the present invention.

Further, for the second embodiment, a wide linearity is obtained by flattening the fluctuation of the differentiation gain characteristic when there is no third npn transistor Q46. Accordingly, there is no meaning unless Vo>VT/2. Further, the range where the effect of flattening of the differentiation gain characteristic is remarkable is up to 5·VT of the voltage Vo. If it exceeds 10·VT, the fluctuation of the differentiation gain characteristic still becomes large with respect to the voltage Vo and may become out of the range aimed at by the present invention.

The voltage Vo should be given as a ratio with the thermoelectric voltage VT. Otherwise, the effect of linearity of the present invention will changed according to the temperature. Note that the design technique of making the current or voltage proportional to the thermoelectric voltage VT, that is, the absolute temperature T, is referred to as the "proportional to ambient temperature" (PTAT) technique etc. and is a general design technique in bipolar integrated circuits.

As described above, in the input circuits of the first embodiment and the second embodiment of the present invention, by positively utilizing the impedance of the same phase mode in the common emitters of the pair of differential transistors, the pair of differential transistors is operated in terms of A and B classes and the linearity of the input circuit is greatly enhanced. As a result, the allowable maximum input thereof can be surprisingly increased three times or more according to the first embodiment and 10 times or more according to the second embodiment without seeing any deterioration of the noise characteristic. Namely, according to the input circuit using bipolar transistors of the present invention, it is possible to achieve both a low noise property and an increased maximum allowable input at a high level.

Next, an explanation will be made of embodiments of the phase adjustment circuit and the control signal generation circuit of the present invention by referring to the drawings.

Figure 17:
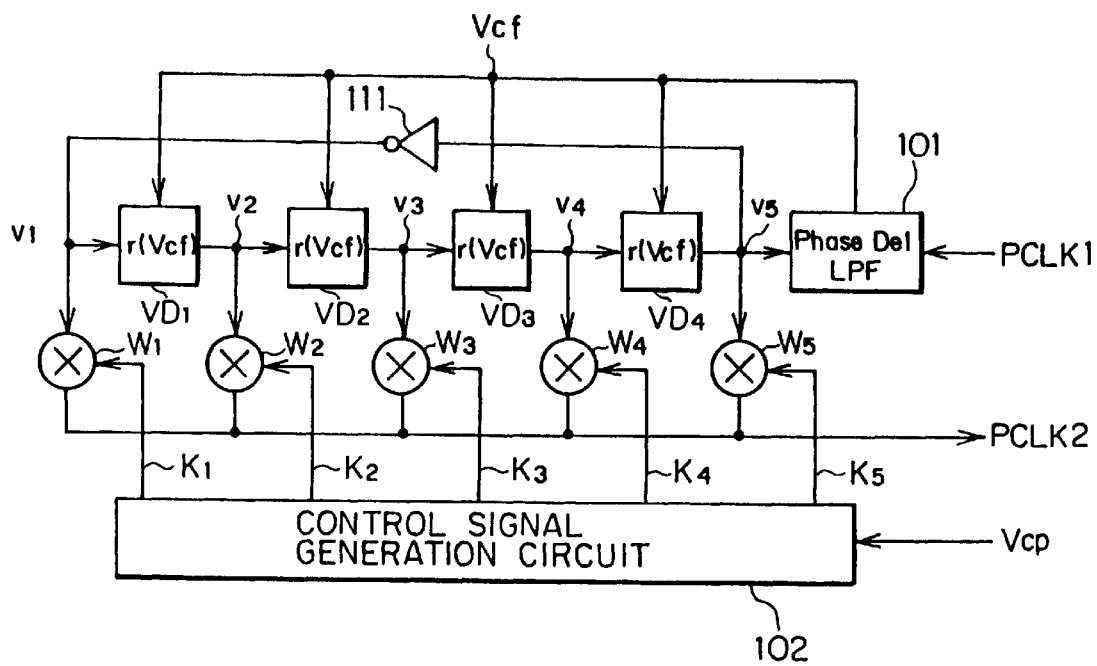
FIG. 17 is a schematic view of the configuration of a phase adjustment circuit according to a third embodiment of the present invention.

FIG. 17 is a schematic view of the configuration of the phase adjustment circuit according to the present invention. The phase adjustment circuit of the present invention is constituted by three main elements. Namely, it is configured provided with a ring type voltage controlled oscillation circuit comprising n number of stages (n=4 in FIG. 17) of variable delay circuits, a control signal generation circuit 102 which weights n+1 number of outputs (v1 to v5) taken out of the ring type voltage controlled oscillation circuit by the phase control signal voltage Vcp to control the phase, and a phase locked loop (PLL) means for comparing the output (v5) of the ring type voltage controlled oscillation circuit and the external pixel clock PCLK1 and locking the phase.

First, the voltage controlled oscillation circuit can be formed by connecting n number of stages of variable delay circuits VD1 to VD4 in series, inverting the output v5 of the final stage variable delay circuit VD4 in phase by an inverter 111, and providing this as negative feedback as the input v1 of the initial stage variable delay circuit VD1. As the variable delay circuits VD1 to VD4, a configuration using the buffer of the CML logic circuit shown in FIG. 17 is one of the most suitable means for realizing the same for the reason that it is suited to high speed operation, the circuit configuration is simple, etc.

Figure 5:
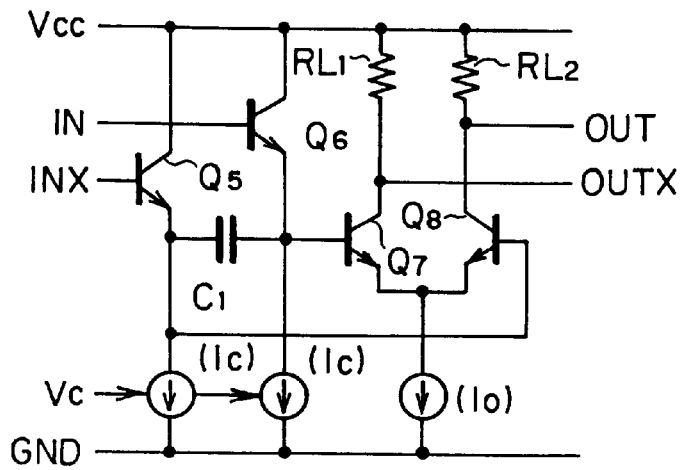
FIG. 5 is a circuit diagram of a typical variable delay circuit using a bipolar transistor circuit.

Further, as the stage number n, at least three stages or four stages are appropriately selected when the buffer of the CML logic circuit shown in FIG. 5 is used as the variable delay circuit. This is because there are only two time constants if the number of stages is two, so stable oscillation cannot be achieved. Note that, in the example of the configuration of FIG. 17, four stages are set.

Further, the phase locked loop means (phase det LPF in the figure) 101 provides at least a phase comparator for comparing phases of the output v5 of the voltage controlled oscillation circuit and an external pixel clock PCLK1 supplied from an external unit and a low pass filter for outputting a delay control signal Vcf based on the result of comparison, controls the delay times in variable delay circuits VD1 to VD4 of the voltage controlled oscillation circuit, and locks the phase.

Figure 18:
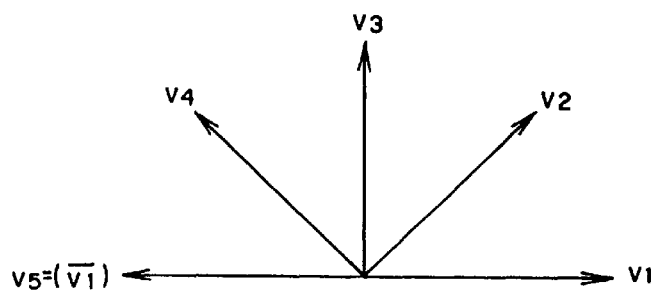
FIG. 18 is an explanatory view for explaining the phase arrangement of outputs in stages of the variable delay circuits.

Consider the phase of the output at each stage of the variable delay circuits when the phase adjustment circuit of the configuration of FIG. 17 is locked in phase with the external pixel clock PCLK1. First, the input v1 of the first stage and the output v5 of the fourth stage must be inverse in phase. Further, during the period from the output v1 of the first stage to the output v4 of the fourth stage, there must be a constant phase transition corresponding to $\tau(Vcf)$, so a phase arrangement as shown in FIG. 18 is exhibited. Namely, this is a phase arrangement as if the phase surface of 0 to 180° is divided by n.

That is, the phase surface of 0 to 180° is divided by n with respect to any n number of stages of variable delay circuits. When the number of output points for weighting is (n+1) with respect to n number of stages of variable delay circuits, that is, in the case of the example of the configuration of FIG. 17, outputs v1 to v5 must be obtained and the output v1 and the output v(n+1) must be inverse in phases. Otherwise, a range of adjustment of from 0 to 180° cannot be secured.

Figure 19:
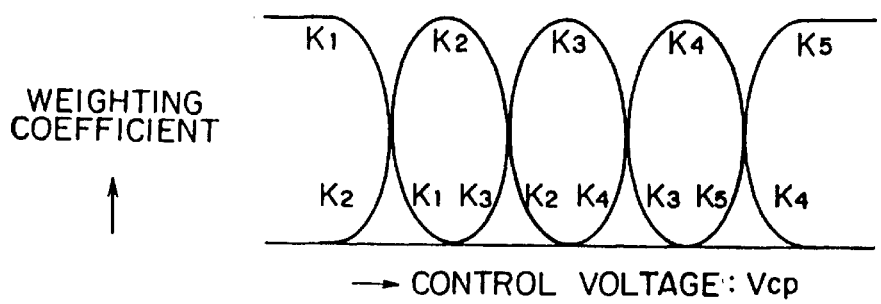
FIG. 19 is an explanatory view of the characteristic of weighting coefficient signals K1 to K5 with respect to a phase control voltage Vcp.

Next, an, explanation will be made of the control signal generation circuit 102. The control signal generation circuit 102 generates a weighting coefficient having a weight as shown in FIG. 19 with respect to the phase control voltage Vcp and sets k (k=n+1=5 in FIG. 17) number of weighting coefficient signals K1 to K5 to be supplied to the weighting circuits W1 to W5. Namely, it performs switching while analogly interpolating the middle section so that the maximum number of the weighting coefficient signals, that is, the weighting coefficient signal K1 to the weighting coefficient signal K5, are given at substantially equal intervals with respect to the phase control voltage Vcp and the sum of the weighting coefficients becomes substantially constant.

As a result, in the configuration of FIG. 17, by the weighting circuits W1 to W5, an internal clock PCLK2 is obtained by respectively weighting k number of signals v1 to v5 of substantially equal phase differences taken out of the variable delay circuits VD1 to VD4 of the voltage controlled oscillation circuit with the k number of weighting coefficient signals K1 to K5 output by the control signal generation circuit 102 and is output as the output signal of the phase adjustment circuit. The internal clock PCLK2 can therefore be freely changed in phase within a range from 0 to 180°. In actuality, a range of adjustment of from 0 to 360° is necessary, but in FIG. 17, this is enough if an inversion circuit is inserted at the input terminal position of for example the external pixel clock PCLK1 or the output terminal position of the internal clock PCLK2 and switched.

Next, an explanation will be made of a more detailed example of the configuration of a third embodiment of the phase adjustment circuit of the present invention. The basic structure thereof is shown in FIG. 17. As the main constituent elements, there are the circuit configuration of the variable delay circuit and the weighting circuit shown in FIG. 20 and the circuit configuration of the control signal generation circuit 102 shown in FIG. 22, respectively.

Figure 20:
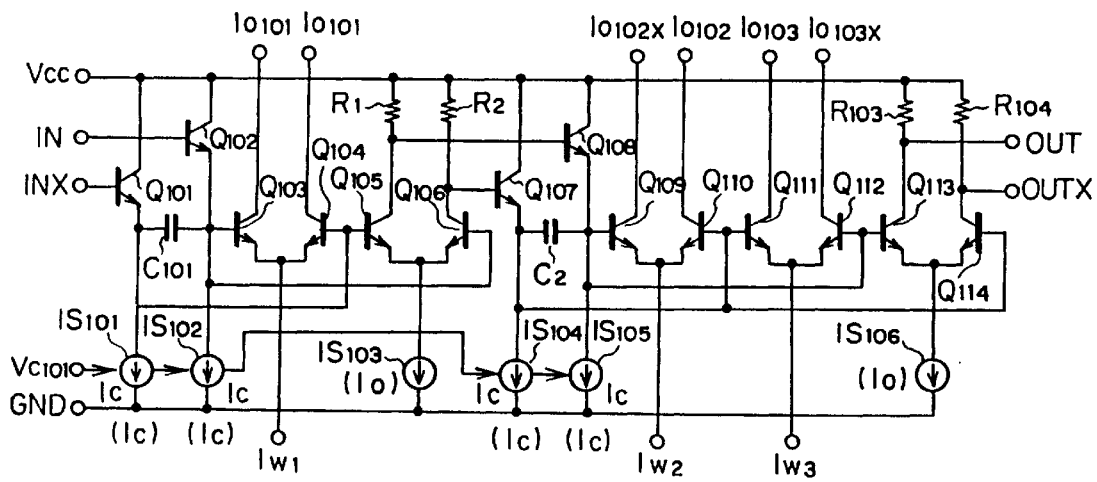
FIG. 20 is a circuit diagram of the configuration of a variable delay circuit and a weighting circuit constituting a ring type voltage controlled oscillation circuit according to a third embodiment of the present invention.

FIG. 20 is a circuit diagram of the configuration of variable delay circuits formed a ring type voltage controlled oscillation circuit and of weighting circuits. In FIG. 20, there are two stages of variable delay circuits and three outputs. The first stage variable delay circuit is constituted by npn transistors (emitter followers) Q101 and Q102 and a capacity element C101. To the output thereof are connected a common-emitter pair of differential npn transistors Q103 and Q104 functioning as an output takeout circuit provided with a weighting function (weighting circuit) and CML gate circuits Q105 and Q106 for driving the next stage variable delay circuit. The common-emitter pair of differential npn transistors Q103 and Q104 functioning as the output takeout circuit (weighting circuit) perform weighting by a weighting current Iw1 supplied from the control signal generation circuit 102 and generate the outputs Io101 and Io101x.

The second stage variable delay circuit basically has the same configuration as that of the first stage variable delay circuit. The difference resides in that two output takeout circuits (weighting circuits) are provided. Namely, two common-emitter pairs of pairs of differential npn transistors Q109, Q110 and Q111, Q112 perform weighting by the two weighting currents Iw102 and Iw103 and generate two sets of outputs Io102, Io102x and Io103, Io103x.

Figure 21:
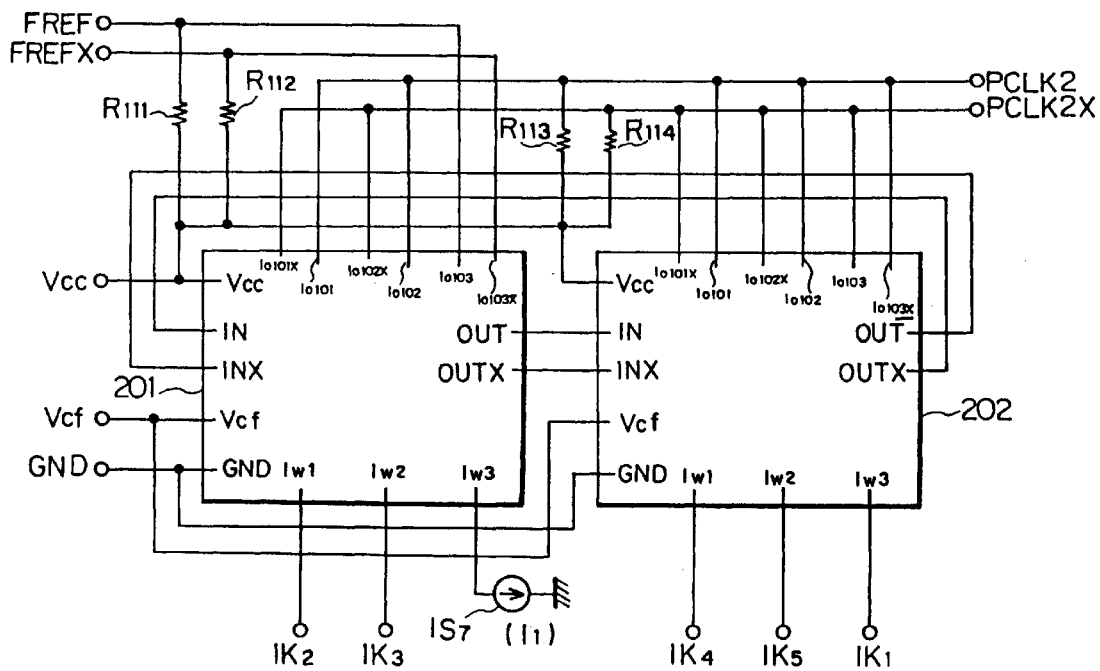
FIG. 21 is a view of the configuration where the ring type voltage controlled oscillation circuit and the weighting circuit are constituted by using two circuits of the configuration of FIG. 20.

FIG. 21 is a view of the configuration of a ring type voltage controlled oscillation circuit and weighting circuits comprised of two sets of the variable delay circuits and weighting circuits shown in FIG. 20. The variable delay circuits VD1 to VD4 have the differential input/output configuration as shown in FIG. 20, therefore the inverter 111 shown in FIG. 17 is not necessary in the feedback from the final stage variable delay circuit VD4 to the initial stage variable delay circuit VD1. It is sufficient to switch and feed back the differential output.

In the left side block 201, the output takeout circuit comprised of the common-emitter pair of differential npn transistors Q103 and Q104 in FIG. 20 corresponds to the weighting circuit W2. Similarly, the output takeout circuit comprised of the common-emitter pair of differential npn transistors Q109 and Q110 corresponds to the weighting circuit W3. Further, other output takeout circuits Q113 and Q114 provided in the second stage are utilized for generating the comparison output for forming the loop of the phase locked loop (PLL) means.

In the right side block 202, the output takeout circuit comprised by the common-emitter pair of differential npn transistors Q103 and Q104 in FIG. 20 corresponds to the weighting circuit W4. The two sets of output takeout circuits Q109, Q110 and Q111, Q112 provided in the second stage are respectively used as the weighting circuits W1 and W5. The inputs of the weighting circuits W1 and W5 are merely inverted in phase. For this reason, only the outputs Io103 and Io103x are inverted from the other outputs and connected to the output terminals PCLK2 and PCLK2X of the internal pixel clock.

Figure 22:
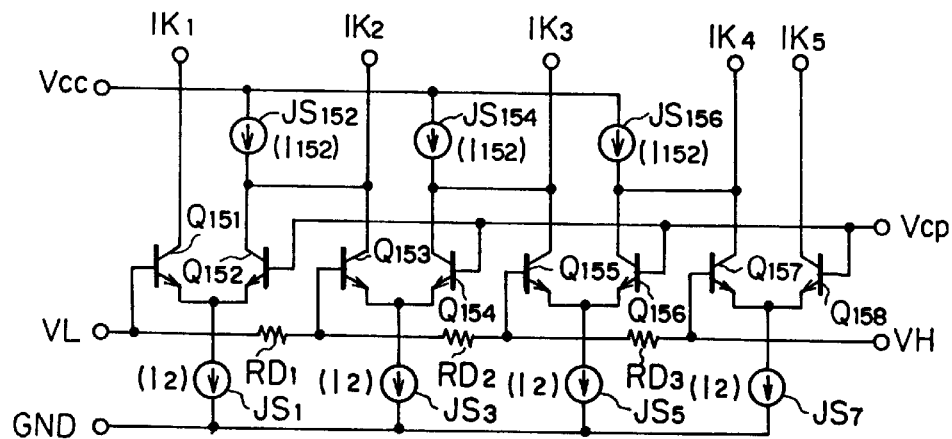
FIG. 22 is a more detailed circuit diagram of the configuration of the control signal generation circuit of the third embodiment.

Next, an explanation will be made of a more detailed circuit configuration of the control signal generation circuit 102. FIG. 22 is a more detailed circuit diagram of the configuration of the control signal generation circuit 102. In FIG. 22, the control signal generation circuit 102 is provided with four sets of common-emitter pairs of differential npn transistors Q151, Q152; Q153, Q154; Q155, Q156; and Q157, Q158. To the bases of the first transistors Q151, 0153, Q155, and Q157 of the common-emitter pairs of differential npn transistors, the voltage obtained by equally dividing the two reference voltages of the reference voltage VH on the high potential side and the reference voltage VL on the low potential side by three resistors RD1, RD2, and RD3 is supplied. Further, the phase control voltage Vcp is supplied to the bases of the second transistors Q152, Q154, Q156, and Q158.

The first weighting coefficient signal output IK1 is taken out of the collector of the first transistor Q151 of the first common-emitter pair of differential npn transistors, the fifth weighting coefficient signal output IK5 is taken out of the collector of the second transistor Q158 of the fourth common-emitter pair of differential npn transistors, collectors of the second transistors Q152, Q154, and Q156 of the i-th (i is at least 1 and not more than 3) common-emitter pairs of differential npn transistors are respectively connected to the collectors of the first transistors Q153, Q155, and Q157 of the i+1-th common-emitter pairs of differential npn transistors, and the i+1-th weighting coefficient signal outputs IK2, IK3 and IK4 are respectively taken out of the collectors of the second transistors Q152, Q154 and Q156 of the i-th common-emitter pairs of differential npn transistors.

Figure 23:
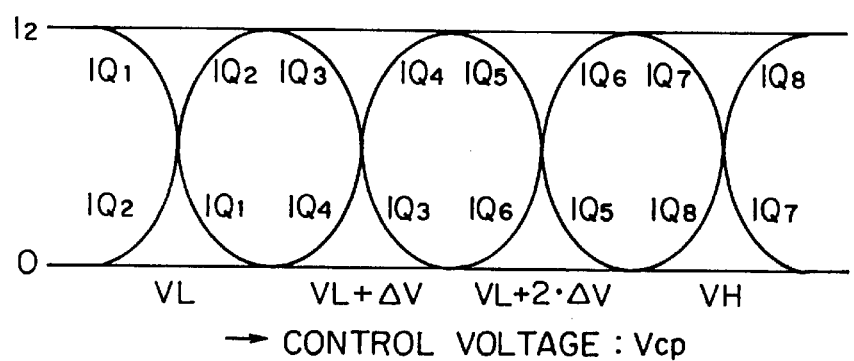
FIG. 23 is an explanatory view of the characteristic of collector currents IQ1 to IQ8 of transistors in the control signal generation circuit with respect to the phase control voltage Vcp.

Here, the potential difference obtained by dividing the interval between two reference potentials VL and VH by three is defined as ΔV. By this, the threshold value at which the collector currents of the first transistor and the second transistor of each common-emitter pair of differential npn transistors cross shifts by amounts of the potential difference ΔV. When the collector currents of the transistors are defined as IQ1 to IQ8, they exhibit the characteristic as shown in FIG. 23 with respect to the phase control voltage Vcp. Note that, I2 in the figure is the current supplied by the current sources JS1 to JS7.

Figure 24:
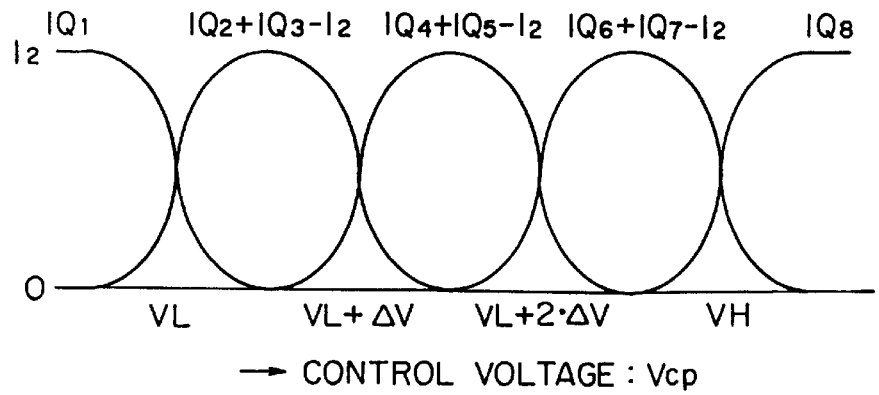
FIG. 24 is an explanatory view of the characteristic of the currents flowing into the weighting coefficient signals IK1 to IK5 minus an offset due to the current source with respect to the phase control voltage Vcp.

Further, as shown in the circuit configuration of FIG. 22, if the transistors Q152, Q153; Q154, Q155; and Q156, Q157 are connected and the offset of the current I152 due to the current source is subtracted, the currents flowing into the weighting coefficients signals IK1 to IK5 exhibit the characteristics as shown in FIG. 24, so it is seen that the desired characteristics explained using the characteristics of FIG. 19 in the example of configuration of FIG. 17 can be realized. For example, the collector current IQ2 of the transistor Q152 and the collector current IQ3 of the transistor Q153 function differentially, but by shifting the threshold value by exactly the potential difference ΔV, the weighting coefficient signal IK2 can be generated only during the period of the potential difference ΔV.

Next, an explanation will be made of modifications of the phase adjustment circuit of the present embodiment. In the third embodiment explained above, the comparison output to the phase locked loop (PLL) means was extracted from a certain stage of the variable delay circuits VD1 to VD4, weighting was applied by the output takeout circuit of each stage, and the combined outputs were used as the second pixel clock PCLK2, but there is no difference even if they are changed around.

Figure 25:
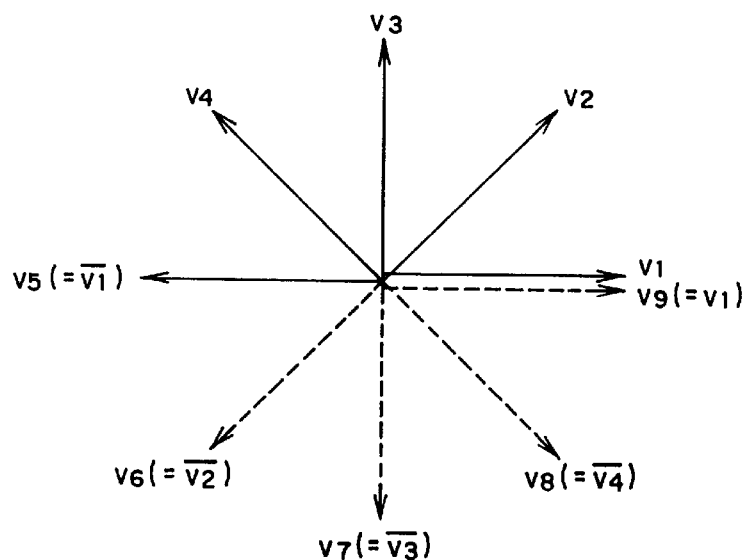
FIG. 25 is an explanatory view of the phase arrangement of outputs in stages of the variable delay circuits where range of adjustments of 0 to 360° are continuously obtained.

Further, in the third embodiment, the range of adjustment by the phase control voltage Vop was 0 to 180° and a phase switching circuit was used to obtain a range of adjustment of 0 to 360°, but it is also possible to constitute the same so that a range of adjustment from 0 to 360° is continuously obtained. The principle thereof is shown in FIG. 25. When signals having phases of v6 to v9 are provided and a control signal generation circuit provided with nine outputs is provided for this, a range of adjustment from 0 to 360° can be continuously obtained. Signals having phases of v6 to v9 can be easily formed by using signals of v1 to v4. Note, in this configuration, although a range of 0 to 360° is continuously obtained, the size of the circuit is increased correspondingly.

Further, in the third embodiment, the ring type voltage controlled oscillation circuit explained using FIG. 20 and FIG. 21 used four stages of variable delay circuits, each comprised of two sets of emitter followers with capacitors provided between the emitters, but the voltage controlled oscillation circuit can function well even with just three stages. Namely, by providing three stages of variable delay circuits and making the phase arrangement of signals in FIG. 18 not every 45°, but every 60°, it is possible to reduce the size of the circuit.

Further, it is also possible to keep the number of stages of the variable delay circuits as it is, sample the signal of the output v2 of the first stage variable delay circuit and the signal of the output v4 of the third stage variable delay circuit in FIG. 18, and combine phases by signals of every 90°. The phase control circuit according to the fourth embodiment of the present invention has a configuration realizing this.

Figure 26:
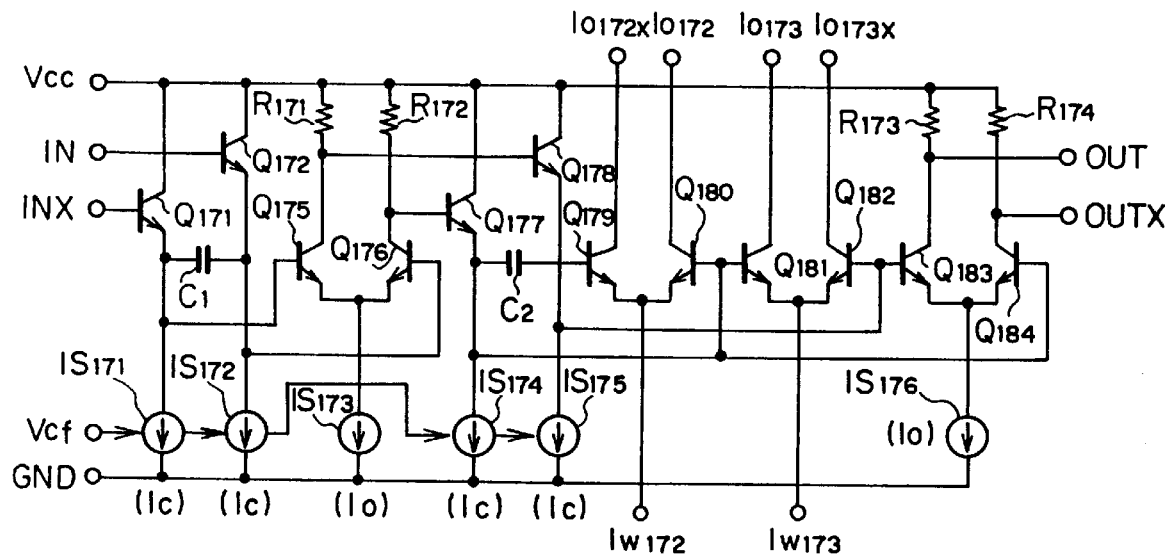
FIG. 26 is a circuit diagram of the configuration of a variable delay circuit and a weighting circuit constituting a ring type voltage controlled oscillation circuit of a fourth embodiment of the present invention.
Figure 27:
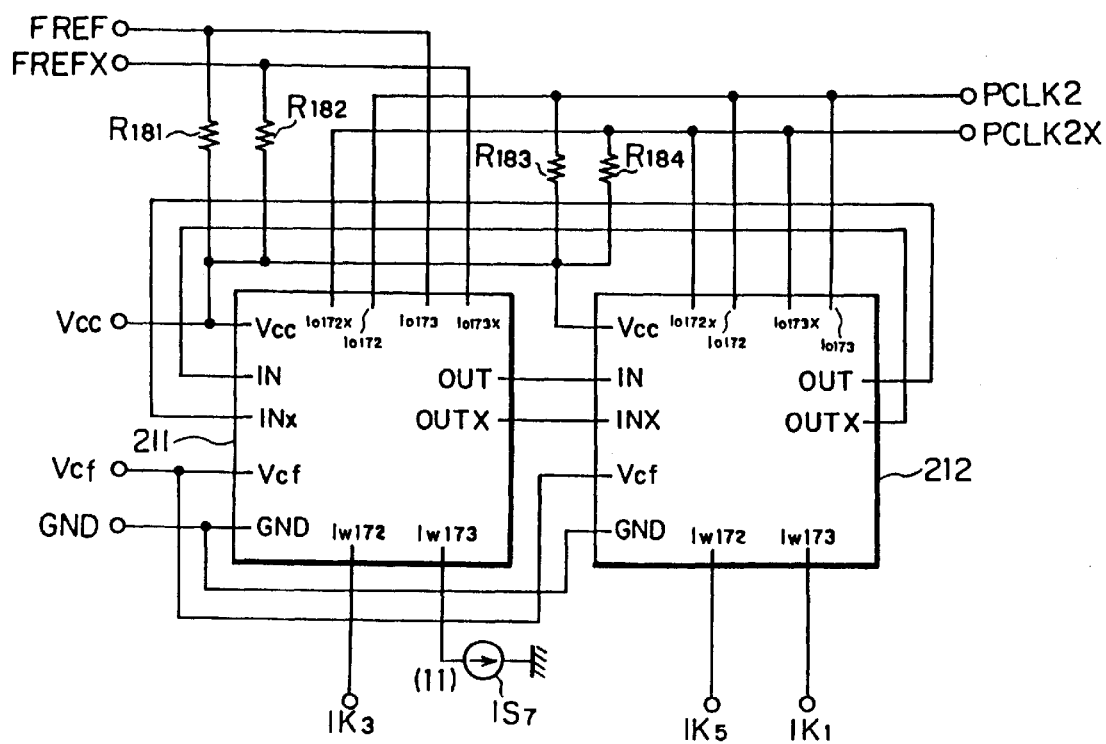
FIG. 27 is a view of the configuration where the ring type voltage controlled oscillation circuit and the weighting circuit are constituted by using two circuits of the configuration of FIG. 26.
Figure 28:
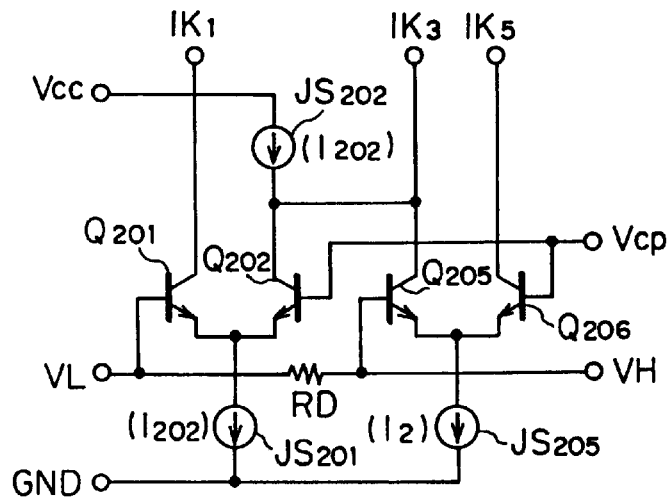
FIG. 28 is a more detailed circuit diagram of the configuration of the control signal generation circuit of the fourth embodiment.

FIG. 26 is a circuit diagram of the configuration of the variable delay circuits constituting a ring type voltage controlled oscillation circuit of the fourth embodiment and weighting circuits. This is configured eliminating the output takeout circuit comprised of the common-emitter pair of differential npn transistors Q103 and Q104 in the third embodiment (FIG. 20). The overall configuration of the ring type voltage controlled oscillation circuit and the weighting circuits becomes as shown in FIG. 27. Namely, along with the elimination of the output takeout circuit comprised of the common-emitter pair of differential npn transistors Q103 and Q104, the number of outputs of the control signal generation circuit changes from five to three, therefore it becomes possible to simplify the configuration as shown in FIG. 28. Note that explanations of parts in FIG. 26, FIG. 27, and FIG. 28 overlapping the explanations of parts in FIG. 20, FIG. 21, and FIG. 22 (third embodiment) are omitted.

The advantage of having a large number of stages of the weighting circuits is that the effect of the overlap characteristic between the control outputs (weighting coefficient signals K1 to K5) shown in FIG. 19 exerted upon the linearity and output amplitude of the control characteristic is small. However, these are not inherent problems. If the overlap characteristic is carefully designed, even in a phase arrangement at every 90° as in the present embodiment, it is possible to realize the desired characteristics without any problem.

Next, the general rule regarding the number n of stages (n is an integer) of the variable delay circuits and the number k of substantially equal phase difference signals taken out of the voltage controlled oscillation circuit or of the weighting coefficient signals (k is a positive integer) will be explained.

When the continuous range of adjustment is set to 180°, the relationship of k=n+1 stands, the phase arrangement is made every 180/n°, and the output of the first stage variable delay circuit and the output of the k-th stage variable delay circuit become inverse in phase. Further, when the continuous range of adjustment is set to 360°, the relationship of k=2·n+1 stands, the phase arrangement is made every 360/n°, and the output of the first stage variable delay circuit and the output of the k-th stage variable delay circuit become the same in phase.

As described above, in the phase adjustment circuits of the third embodiment and the fourth embodiment, a plurality of signals v1 to v5 of substantially equal phase difference are generated by the ring type voltage controlled oscillation circuits (VD1 to VD4), the weighting coefficient signals K1 to K5 controlled by an external phase control signal Vcp are used to weight the substantially equal phase difference signals v1 to v5, and the phase is adjusted by the weighted result PCLK2, therefore the adjustment sensitivity and the range of adjustment can be held constant without regard as to the pixel clock frequency and it becomes possible to obtain a good linearity and stability of adjustment.

Namely, a range of adjustment from 0 to 360° can be always obtained irrespective of the pixel clock. Even if the pixel clock changes in a wide range, the required number of stages of the variable delay circuits does not increase as in the related art. Therefore, the invention is particularly optimum in the case of handling several types of display modes such as in a multi-scan display. Further, in the phase adjustment circuit and the control signal generation circuit of the present invention, the linearity of the control characteristic is good. This is because while the weighting coefficient signals K1 to K5 are generated by interpolating the middle section so that the maximum number of coefficients are given to the phase control circuit Vcp at substantially equal intervals and the sum thereof is substantially constant, basically the weighting coefficient signals K1 to K5 are switched. Further, in the phase adjustment circuit of the present embodiment, not the delay time, but the phase is controlled; therefore even if the pixel clock frequency changes, the control sensitivity does not change. Accordingly, together with the good linearity, when the adjustment data is transferred as digital data, even a low resolution is enough. Further, the phase adjustment circuit of the present invention is stable against fluctuations in the temperature and the power supply voltage. This is because the delay time of the variable delay circuit is automatically adjusted by the phase locked loop (PLL) means so as to correspond to the phase of the pixel clock (external clock PCLK1)

The control signal generation circuit according to the present invention has the configuration as shown in for example FIG. 22 as explained in detail by the explanation of the embodiment of the phase adjustment circuit. Note that the control signal generation circuit of the present invention is not particularly limited to the phase adjustment of the pixel clock of an LCD and can be applied for various purposes for selecting a plurality of signals while interpolating this in an analog manner.

Figure 29:
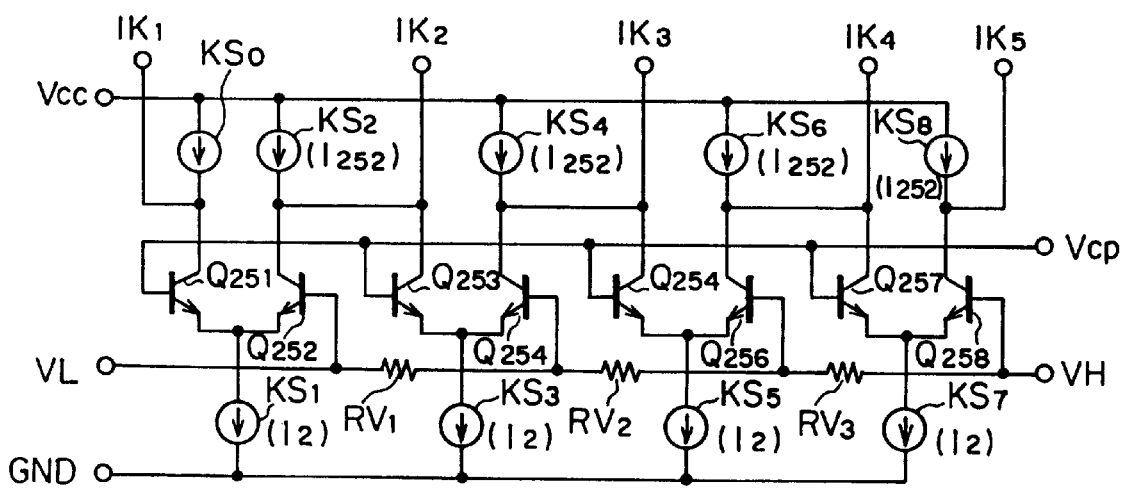
FIG. 29 is a circuit diagram of the configuration of a signal generation circuit generating control currents IK1 to IK5 in a direction of outflow from the control signal generation circuit.

Further, the control signal generation circuit shown in FIG. 22 generates control currents IK1 to IK5 in a direction flowing into the control signal generation circuit, but for certain purpose, there also exists cases where control currents of a direction flowing out from the control signal generation circuit are more convenient. FIG. 29 is a circuit diagram of the configuration of a signal generation circuit for generating control currents IK1 to IK5 in a direction flowing out from the control signal generation circuit. In the figure, the same references are given to parts the same as those of FIG. 22 (third embodiment) and explanations thereof will be omitted.

The difference of FIG. 29 from FIG. 22 resides in that the voltages supplied to bases of the first and second transistors Q251 and Q252, Q253 and Q254, Q255 and Q256, and Q257 and Q258 of the common-emitter pairs of differential npn transistors become inverse and in that current sources for supplying a current I252 to all control signal outputs IK1 to IK5 are connected.

Namely, in FIG. 29, there are k number of current sources KS0, KS2, KS4, KS6, and KS8 respectively connected to all k (k=5) number of control signal outputs IK1 to IK5, the phase control signal Vcp is supplied to the bases of the first transistors Q251, Q253, Q255, and Q257 for k-1 number of common-emitter pairs of differential npn transistors, and voltages obtained by substantially equally dividing the first reference potential VH and the second reference potential VL by k-1 by the resistors RV1, RV2, and RV3 are supplied to the bases of the second transistors Q252, Q254, Q256, and Q258.

As explained above, according to the control signal generation circuit of the present invention and the phase adjustment circuit using the same, a plurality of signals of substantially equal phase difference are generated by the voltage controlled oscillation circuit, weighting coefficient signals controlled by the external phase control signal are used to weight the substantially equal phase difference signals, and the phase is adjusted by the result of weighting, therefore the adjustment sensitivity and the range of adjustment can be held constant without regard to the pixel clock frequency and it becomes possible to achieve a good linearity and stability of the adjustment.

While the invention has been described by reference to specific embodiments chosen for purposes of illustration, it should be apparent that numerous modifications could be made thereto by those skilled in the art without departing from the basic concept and scope of the invention.

What is claimed is:

1. An input circuit, comprising:

a pair of differential transistors provided with first and second transistors with emitters which are commonly connected and through which a collector current flows when there is no signal;

a bias voltage source for biasing the base potential of each of the first and second transistors;

an inputting means for differentially applying first and second input signal voltages superimposed on outputs of the bias voltage source to bases of the first and second transistors;

an impedance circuit connected to the common emitters of the pair of differential transistors and provided with a differential resistor; and an outputting means for differentially obtaining output signals from the collector currents of the first and second transistors, wherein the product of the sum of collector currents of the first and second transistors when there is no signal and the differential resistor of the impedance circuit is set to a value of less than a thermoelectric voltage of the first and second transistors.

2. An input circuit, comprising:

a pair of differential transistors provided with first and second transistors with emitters which are commonly connected and through which the collector current (IO) flows when there is no signal;

a bias voltage source for biasing the base potential of each of the first and second transistors;

an inputting means for differentially applying first and second input signal voltages superimposed on outputs of the bias voltage source to bases of the first and second transistors;

an impedance circuit connected to the common emitters of the pair of differential transistors and provided with a differential resistor;

a third transistor with an emitter which is connected to the common emitters of the first and second transistors via a resistor element and through which a collector current (Ix) flows when there is no signal;

a second bias voltage source for biasing the base potential of the third transistor; and an outputting means for differentially obtaining output signals from the collector currents of the first and second transistors, wherein the product of the sum ($2 \times Io + Ix$) of the collector currents of the first and second transistors when there is no signal and the collector current of the third transistor when there is no signal and the differential resistor of the impedance circuit is set to a value of at least ½ and not more than 10 times of the thermoelectric voltage of the first and second transistors.

3. An input circuit, comprising:

a pair of differential transistors provided with first and second transistors with emitters which are commonly connected and through which a collector current (Io) flows when there is no signal;

a bias voltage source for biasing the base potential of each of the first and second transistors;

an inputting means for differentially applying first and second input signal voltages superimposed on outputs of the bias voltage source to bases of the first and second transistors;

an impedance circuit connected to the common emitters of the pair of differential transistors and provided with a differential resistor;

a third transistor with an emitter which is connected to the common emitters of the first and second transistors and through which a collector current (Ix) flows when there is no signal;

a second bias voltage source for biasing the base potential of the third transistor; and an outputting means for differentially obtaining output signals from the collector currents of the first and second transistors, wherein the product of the sum ($2 \times Io + Ix$) of the collector currents of the first and second transistors when there is no signal and the collector current of the third transistor when there is no signal and the differential resistor of the impedance circuit is set to a value of at least ½ and not more than 10 times the thermoelectric voltage of the first and second transistors.

* * * * *